(12) United States Patent
Hasegawa

(10) Patent No.: US 6,891,703 B2
(45) Date of Patent: May 10, 2005

(54) EXCHANGE COUPLED FILM HAVING MAGNETIC LAYER WITH NON-UNIFORM COMPOSITION AND MAGNETIC SENSING ELEMENT INCLUDING THE SAME

(75) Inventor: Naoya Hasegawa, Niigata-ken (JP)

(73) Assignee: ALPS Electric Co., Ltd., Tokyo (JP)

( * ) Notice: Subject to any disclaimer, the term of this patent is extended or adjusted under 35 U.S.C. 154(b) by 86 days.

(21) Appl. No.: 10/197,955

(22) Filed: Jul. 18, 2002

(65) Prior Publication Data

US 2003/0030946 A1 Feb. 13, 2003

(30) Foreign Application Priority Data

Jul. 25, 2001 (JP) ........................................ 2001-224544
Apr. 3, 2002 (JP) ........................................ 2002-100795

(51) Int. Cl.⁷ ............................................... G11B 5/39
(52) U.S. Cl. ............................................... 360/324.11
(58) Field of Search ....................... 360/324.11, 324.12, 360/324.1, 324, 326

(56) References Cited

U.S. PATENT DOCUMENTS

| | | | |
|---|---|---|---|
| 6,303,218 B1 | 10/2001 | Kamiguchi et al. | |
| 6,313,973 B1 | 11/2001 | Fuke et al. | |
| 6,456,469 B1 * | 9/2002 | Gill | 360/324.11 |
| 6,548,186 B1 * | 4/2003 | Carey et al. | 428/611 |
| 6,549,383 B1 * | 4/2003 | Gill | 360/324.11 |
| 6,587,317 B2 * | 7/2003 | Gill | 360/324.11 |
| 6,650,512 B1 * | 11/2003 | Gill | 360/324.12 |

* cited by examiner

Primary Examiner—Angel Castro C
(74) Attorney, Agent, or Firm—Brinks Hofer Gilson & Lione

(57) ABSTRACT

A first magnetic sublayer includes a region containing X (e.g., Cr), which extends from the interface with an antiferromagnetic layer toward a nonmagnetic intermediate sublayer, and a region not containing X, which extends from the interface with the nonmagnetic intermediate sublayer toward the antiferromagnetic layer. Consequently, both the unidirectional exchange bias magnetic field (Hex*) in the pinned magnetic layer and the rate of change in resistance (ΔR/R) can be improved.

33 Claims, 12 Drawing Sheets

(MAGNETIC MOMENT PER UNIT AREA OF SECOND MAGNETIC SUBLAYER − MAGNETIC MOMENT PER UNIT AREA OF FIRST MAGNETIC SUBLAYER), (T-nm)

(MAGNETIC MOMENT PER UNIT AREA OF SECOND MAGNETIC SUBLAYER − MAGNETIC MOMENT PER UNIT AREA OF FIRST MAGNETIC SUBLAYER), (T-nm)

EXCHANGE COUPLED FILM HAVING MAGNETIC LAYER WITH NON-UNIFORM COMPOSITION AND MAGNETIC SENSING ELEMENT INCLUDING THE SAME

BACKGROUND OF THE INVENTION

1. Field of the Invention

The present invention relates to an exchange coupled film which includes an antiferromagnetic layer and a ferromagnetic layer and in which the magnetization direction of the ferromagnetic layer is pinned in a predetermined direction by an exchange coupling magnetic field (Hex) generated at the interface between the antiferromagnetic layer and the ferromagnetic layer, and to a magnetic sensing element including the exchange coupled film. More particularly, the invention relates to an exchange coupled film in which read characteristics, such as the rate of change in resistance and the unidirectional exchange bias magnetic field (Hex*), and reliability can be improved, and to a magnetic sensing element including the exchange coupled film.

2. Description of the Related Art

FIG. 18 is a partial sectional view showing the structure of a conventional magnetic sensing element, viewed from the surface facing a recording medium.

As shown in FIG. 18, an antiferromagnetic layer 30 composed of PtMn or the like is formed on an underlayer 14 composed of Ta or the like.

A pinned magnetic layer 31 is formed on the antiferromagnetic layer 30. The pinned magnetic layer 31 has a laminated ferrimagnetic structure including three sublayers, i.e., a first magnetic sublayer 34, a second magnetic sublayer 36, and a nonmagnetic intermediate sublayer 35. The magnetic sublayers 34 and 36 are composed of, for example, a CoFe alloy, and the nonmagnetic intermediate sublayer 35 is composed of Ru or the like.

A nonmagnetic material layer 32 composed of Cu or the like is formed on the pinned magnetic layer 31, and a free magnetic layer 33 composed of NiFe or the like is formed on the nonmagnetic material layer 32. A protective layer 7 composed of Ta or the like is formed on the free magnetic layer 33.

Hard bias layers 5 are formed at both sides in the track width direction (in the X direction) of the laminate including the underlayer 14 to the protective layer 7, and electrode layers 8 are formed on the hard bias layers 5.

In the magnetic sensing element, when an exchange coupling magnetic field (Hex) is generated between the first magnetic sublayer 34 and the antiferromagnetic layer 30 by annealing treatment in a magnetic field, the first magnetic sublayer 34 in contact with the antiferromagnetic layer 30 is magnetized, for example, in the Y direction, and the second magnetic sublayer 36 in contact with the nonmagnetic material layer 32 is magnetized in a direction opposite to the Y direction by the coupling magnetic field due to the RKKY interaction between the second magnetic sublayer 36 and the first magnetic sublayer 34.

The magnetization direction of the free magnetic layer 33 is aligned in the X direction by a longitudinal magnetic field from the hard bias layers 5.

When the pinned magnetic layer 31 has the laminated ferrimagnetic structure as shown in FIG. 18, the second magnetic sublayer 36 actually contributes to the magnetoresistance effect.

Consequently, when a sensing current from the electrode layer 8 mainly flows through the nonmagnetic material layer 32, if the sensing current shunts to the first magnetic sublayer 34, shunt loss occurs, resulting in a decrease in the rate of change in resistance (ΔR/R).

In order to reduce the shunt loss, an attempt was made in which Cr or the like was incorporated with the first magnetic sublayer 34 composed of a CoFe alloy or the like to increase the resistivity of the first magnetic sublayer 34.

As a result, the resistivity of the first magnetic sublayer 34 was increased, the sensing current from the electrode layer 8 did not easily shunt to the first magnetic sublayer 34, and the rate of change in resistance was improved. However, the unidirectional exchange bias magnetic field (Hex*) was significantly decreased.

Herein, the unidirectional exchange bias magnetic field (Hex*) is the combination of the exchange coupling magnetic field (Hex) primarily generated between the antiferromagnetic layer 30 and the first magnetic sublayer 34 and the coupling magnetic field due to the RKKY interaction generated between the first magnetic sublayer 34 and the second magnetic sublayer 36.

FIG. 19 is a graph which shows the relationship between the thickness and the unidirectional exchange bias magnetic field (Hex*) of the first magnetic sublayer 34 composed of $CoFeCr_{5at\%}$ in the magnetic sensing element having the same layered structure as that shown in FIG. 18.

As shown in FIG. 19, when the first magnetic sublayer 34 is composed of a CoFe alloy, a significantly high unidirectional exchange bias magnetic field (Hex*) is exhibited. On the other hand, when the first magnetic sublayer 34 is composed of CoFeCr, the unidirectional exchange magnetic field rapidly decreases.

As shown in FIG. 19, as the thickness of the first magnetic sublayer 34 increases, the unidirectional exchange bias magnetic field (Hex*) increases. However, when the thickness of the first magnetic sublayer 34 is increased, the amount of shunting of the sensing current to the first magnetic sublayer 34 increases. After all, in the conventional magnetic sensing element, it was not possible to improve the unidirectional exchange bias magnetic field (Hex*) and the rate of change in resistance (ΔR/R) simultaneously in the pinned magnetic layer 31.

Additionally, when the unidirectional exchange bias magnetic field (Hex*) is decreased, the pinned magnetic layer 31 cannot be pinned appropriately, the magnetic sensing element is easily affected by electrostatic discharge (ESD), and current-carrying reliability is decreased.

In the magnetic sensing element having the structure shown in FIG. 18, as the track width is decreased, the magnetization direction of the side regions in the track width direction of the pinned magnetic layer 31 is inclined with respect to the height direction (Y direction) under the strong influence of the longitudinal bias magnetic field from the hard bias layers 5. Due to the inclination of magnetization, read output decreases and asymmetry deteriorates. Such a problem is also caused in the magnetic sensing element having the exchange bias system. In the exchange bias system, annealing treatment is performed twice in different magnetic fields. Even if the magnetization of the pinned magnetic layer 31 is pinned in the height direction by first annealing treatment in the magnetic field in the height direction, when second annealing treatment is performed in the track width direction, the magnetization of the pinned magnetic layer 31 is inclined from the height direction.

As the recording densities are improved, the element height of the magnetic sensing element is decreased, and the magnetic sensing element becomes susceptible to electrostatic discharge (ESD), etc.

SUMMARY OF THE INVENTION

It is an object of the present invention to provide an exchange coupled film in which the film construction of the first magnetic sublayer of the pinned magnetic layer having a laminated ferrimagnetic structure is improved so that read characteristics, such as the rate of change in resistance and the unidirectional exchange bias magnetic field (Hex*), and reliability of the pinned magnetic layer are simultaneously improved. It is another object of the present invention provide a magnetic sensing element including the exchange coupled film.

In one aspect of the present invention, an exchange coupled film includes an antiferromagnetic layer and a ferromagnetic layer, the magnetization direction of the ferromagnetic layer being pinned in a predetermined direction by an exchange coupling magnetic field generated at the interface between the antiferromagnetic layer and the ferromagnetic layer. The ferromagnetic layer has a laminated ferrimagnetic structure including a first magnetic sublayer formed in contact with the antiferromagnetic layer, and a second magnetic sublayer facing the first magnetic sublayer with a nonmagnetic intermediate sublayer therebetween. The first magnetic sublayer includes a region containing X, wherein X is at least one element selected from the group consisting of Cr, Ti, V, Zr, Nb, Mo, Hf, Ta, and W, which extends from the interface with the antiferromagnetic layer toward the nonmagnetic intermediate sublayer, and a region not containing X which extends from the interface with the nonmagnetic intermediate sublayer toward the antiferromagnetic layer.

Preferably, the first magnetic sublayer contains CoFe alloys as major ingredients, the region containing X is composed of a CoFeX alloy, and the region not containing X is composed of a CoFe alloy.

In the present invention, as described above, the antiferromagnetic layer side of the first magnetic sublayer of the pinned magnetic layer having the laminated ferrimagnetic structure contains X, and the region not containing X lies in the nonmagnetic intermediate sublayer side of the first magnetic sublayer.

The magnetic region containing X has a higher resistivity compared to the magnetic region not containing X.

As will be shown in the experimental results described below, if the magnetic region containing X lies in the antiferromagnetic side of the first magnetic sublayer, the exchange coupling magnetic field (Hex) generated between the antiferromagnetic layer and the magnetic region containing X is increased compared with the case in which the magnetic region not containing X is brought into contact with the antiferromagnetic layer.

On the other hand, if the magnetic region not containing X lies in the nonmagnetic intermediate sublayer side of the first magnetic sublayer, the coupling magnetic field due to the RKKY interaction generated between the first and second magnetic sublayers sandwiching the nonmagnetic intermediate sublayer is increased compared with the case in which the magnetic region containing X is brought into contact with the nonmagnetic intermediate sublayer.

Based on the experimental results described above, in the present invention, the magnetic region containing X is provided on the antiferromagnetic layer side of the first magnetic sublayer, and the magnetic region not containing X is provided on the nonmagnetic intermediate sublayer side of the first magnetic sublayer. Consequently, the exchange coupling magnetic field (Hex) generated between the first magnetic sublayer and the antiferromagnetic layer can be increased, and the coupling magnetic field due to the RKKY interaction can also be increased. Therefore, the unidirectional exchange bias magnetic field (Hex*) in the pinned magnetic layer can be appropriately increased compared with the conventional case.

Moreover, in the present invention, since the region containing X having a high resistivity lies in the antiferromagnetic layer side of the first magnetic sublayer, it is possible to decrease the amount of shunting of the sensing current flowing into the first magnetic sublayer, and thus, the so-called "shunt loss" can be decreased, and the rate of change in resistance ($\Delta R/R$) can be improved when the exchange coupled film of the present invention is applied to a magnetic sensing element.

That is, in accordance with the present invention, the unidirectional exchange bias magnetic field (Hex*) in the pinned magnetic layer can be increased, current-carrying reliability, such as electromigration resistance, can be increased, and the rate of change in resistance ($\Delta R/R$) can be improved. By using the exchange coupled film of the present invention, it is possible to manufacture a magnetic sensing element which is suitable for higher recording densities.

In another aspect of the present invention, an exchange coupled film includes an antiferromagnetic layer and a ferromagnetic layer, the magnetization direction of the ferromagnetic layer being pinned in a predetermined direction by an exchange coupling magnetic field generated at the interface between the antiferromagnetic layer and the ferromagnetic layer. The ferromagnetic layer has a laminated ferrimagnetic structure including a first magnetic sublayer formed in contact with the antiferromagnetic layer, and a second magnetic sublayer facing the first magnetic sublayer with a nonmagnetic intermediate sublayer therebetween. The first magnetic sublayer contains X, wherein X is at least one element selected from the group consisting of Cr, Ti, V, Zr, Nb, Mo, Hf, Ta, and W. The X content in the vicinity of the interface between the first magnetic sublayer and the antiferromagnetic layer is higher than the X content in the vicinity of the interface between the first magnetic sublayer and the nonmagnetic intermediate sublayer.

Preferably, the first magnetic sublayer is composed of a magnetic material including a CoFe alloy containing X.

Although the nonmagnetic intermediate sublayer side of the first magnetic sublayer contains X, the X content is very low, and the X content is adjusted so as to increase toward the interface between the first magnetic sublayer and the antiferromagnetic layer.

In this aspect of the present invention, the exchange coupling magnetic field (Hex) generated at the interface between the first magnetic sublayer and the antiferromagnetic layer can also be increased, and the coupling magnetic field due to the RKKY interaction can also be increased. Therefore, the unidirectional exchange bias magnetic field (Hex*) in the pinned magnetic layer can be appropriately increased compared with the conventional case.

Moreover, since the first magnetic sublayer contains X, the resistivity is high, and therefore, it is possible to decrease the amount of shunting of the sensing current flowing into the first magnetic sublayer, and the rate of change in resistance ($\Delta R/R$) can be improved appropriately.

Consequently, in accordance with the exchange coupled film and the magnetic sensing element including the same, the unidirectional exchange bias magnetic field (Hex*) in the pinned magnetic layer can be increased, current-carrying reliability, such as electromigration resistance, can be increased, and the rate of change in resistance (ΔR/R) can be improved. It is also possible to manufacture a magnetic sensing element which is suitable for higher recording densities.

In the present invention, preferably, the first magnetic sublayer includes a region in which the X content gradually decreases from the antiferromagnetic layer side toward the nonmagnetic intermediate sublayer side.

In such a case, the first magnetic sublayer has a so-called "composition gradient", which is produced by the manufacturing method which will be described below.

In another aspect of the present invention, an exchange coupled film includes an antiferromagnetic layer and a ferromagnetic layer, the magnetization direction of the ferromagnetic layer being pinned in a predetermined direction by an exchange coupling magnetic field generated at the interface between the antiferromagnetic layer and the ferromagnetic layer. The ferromagnetic layer has a laminated ferrimagnetic structure including a first magnetic sublayer formed in contact with the antiferromagnetic layer, and a second magnetic sublayer facing the first magnetic sublayer with a nonmagnetic intermediate sublayer therebetween. The first magnetic sublayer includes at least two magnetic zones. The magnetic zone in contact with the antiferromagnetic layer is composed of a magnetic material containing X, wherein X is at least one element selected from the group consisting of Cr, Ti, V, Zr, Nb, Mo, Hf, Ta, and W, and the magnetic zone in contact with the nonmagnetic intermediate sublayer is composed of a magnetic material not containing X.

Preferably, the magnetic zone in contact with the antiferromagnetic layer is composed of a CoFeX alloy, and the magnetic zone in contact with the nonmagnetic intermediate sublayer is composed of a CoFe alloy.

In this aspect of the present invention, the first magnetic sublayer constituting the pinned magnetic layer includes at least two magnetic zones, and the magnetic zone in contact with the antiferromagnetic layer is composed of a magnetic material containing X having a high resistivity. Consequently, the exchange coupling magnetic field (Hex) generated between the magnetic zone and the antiferromagnetic layer can be increased appropriately.

On the other hand, the magnetic zone in contact with the nonmagnetic interlayer is composed of a magnetic material not containing X having a low resistivity. Consequently, the coupling magnetic field due to the RKKY interaction generated between the magnetic zone and the second magnetic sublayer can be increased.

Therefore, the unidirectional exchange bias magnetic field (Hex*) in the pinned magnetic layer can be appropriately increased compared with the conventional case.

Moreover, since the magnetic zone containing X having a high resistivity is formed in the first magnetic sublayer, it is possible to decrease the amount of shunting of the sensing current flowing into the first magnetic sublayer, the so-called "shunt loss" can be reduced, and the rate of change in resistance (ΔR/R) can be improved.

Therefore, in accordance with the present invention, the unidirectional exchange bias magnetic field (Hex*) in the pinned magnetic layer can be increased, current-carrying reliability, such as electromigration resistance, can be increased, and the rate of change in resistance (ΔR/R) can be improved. By using the exchange coupled film of the present invention, it is possible to manufacture a magnetic sensing element which is suitable for higher recording densities.

In the present invention, when the region containing X is composed of a CoFeX alloy and the region not containing X is composed of a CoFe alloy, preferably, the ratio of the thickness of the region composed of the CoFeX alloy to the total thickness of the first magnetic sublayer is greater than 0 and less than or equal to 0.61.

Alternatively, when the region containing X is composed of a CoFeX alloy and the region not containing X is composed of a CoFe alloy, preferably, the ratio of the thickness of the region composed of the CoFeX alloy to the total thickness of the first magnetic sublayer is greater than 0 and less than or equal to 0.36.

Alternatively, when the region containing X is composed of a CoFeX alloy and the region not containing X is composed of a CoFe alloy, preferably, the ratio of the thickness of the region composed of the CoFeX alloy to the total thickness of the first magnetic sublayer is in the range of 0.26 to 0.82.

Alternatively, when the region containing X is composed of a CoFeX alloy and the region not containing X is composed of a CoFe alloy, preferably, the ratio of the thickness of the region composed of the CoFeX alloy to the total thickness of the first magnetic sublayer is in the range of 0.12 to 0.61.

Alternatively, when the region containing X is composed of a CoFeX alloy and the region not containing X is composed of a CoFe alloy, preferably, the ratio of the thickness of the region composed of the CoFeX alloy to the total thickness of the first magnetic sublayer is in the range of 0.26 to 0.61.

Alternatively, when the region containing X is composed of a CoFeX alloy and the region not containing X is composed of a CoFe alloy, preferably, the ratio of the thickness of the region composed of the CoFeX alloy to the total thickness of the first magnetic sublayer is in the range of 0.26 to 0.36.

In the present invention, in the CoFe alloys, the Co/Fe atomic ratio is preferably in the range of 85/15 to 96/4.

In the present invention, the X content in the region containing X is in the range of 3 to 15 atomic percent.

In the present invention, the magnetic moment difference obtained by subtracting the magnetic moment per unit area of the first magnetic sublayer from the magnetic moment per unit area of the second magnetic sublayer is preferably in the range of −0.63 to 0.63 T·nm, wherein a magnetic moment difference of 0 T·nm is excluded therefrom. According to the experimental results described below, if the magnetic moment difference (Net Mst) is set to be in the range of −0.63 to 0.63 T·nm, wherein a magnetic moment difference of 0 T·nm is excluded therefrom, the read output can be effectively improved, and the inclination angle of the magnetization of the second magnetic sublayer can be set at substantially zero.

The inclination angle of the magnetization of the second magnetic sublayer corresponds to an inclination with respect to the height direction which is set as 0 degrees. The experimental method will be described below. Preferably, the inclination angle of the magnetization of the second magnetic sublayer is as small as possible because the asymmetry can be reduced and the read output can be improved.

As described above, in the present invention, by optimizing the film construction of the first magnetic sublayer and by optimizing the magnitude of the magnetic moment per unit area of the first magnetic sublayer relative to the magnetic moment per unit area of the second magnetic sublayer, read characteristics can be further improved.

More preferably, the magnetic moment difference is negative. That is, the magnetic moment difference is more preferably greater than or equal to −0.63 T·nm and less than 0 T·nm. According to the experimental results described below, if the magnetic moment difference is greater than or equal to −0.63 T·nm and less than 0 T·nm, the inclination angle of the magnetization of the second magnetic sublayer can be brought close to zero degrees, and read output can be effectively improved compared to the conventional case. When the first magnetic sublayer is composed of a magnetic material not containing X as is the conventional case, if the magnetic moment difference is negative, the proportion of the sensing current shunting to the first magnetic sublayer is increased, and the read output rapidly decreases. However, in the present invention, since the region containing X having a high resistivity lies in the first magnetic sublayer, even if the magnetic moment difference is negative, the proportion of the sensing current shunting to the first magnetic sublayer is smaller compared to the conventional case, and therefore, in the present invention, even if the magnetic moment difference is negative, it is possible to improve the read output effectively compared to the conventional case.

In the present invention, preferably, the thickness of the first magnetic sublayer is larger than the thickness of the second magnetic sublayer. The magnetic moment per unit area corresponds to the product of the saturation magnetization (Ms) and the thickness (t). As described above, the magnetic moment difference is preferably negative, that is, the magnetic moment per unit area of the first magnetic sublayer is preferably larger than the magnetic moment per unit area of the second magnetic sublayer, and in order to set the magnetic moment difference to be negative, the thickness of the first magnetic sublayer is preferably larger than the thickness of the second magnetic sublayer.

When the first magnetic sublayer is composed of a magnetic material not containing X as is the conventional case, if the thickness of the first magnetic sublayer is larger than the thickness of the second magnetic sublayer, the proportion of the sensing current shunting to the first magnetic sublayer is increased. However, in the present invention, since the region containing X lies in the first magnetic sublayer, even if the thickness of the first magnetic sublayer is larger than the thickness of the second magnetic sublayer, the proportion of the sensing current shunting to the first magnetic sublayer is smaller compared to the conventional case, and it is possible to reduce the decrease in the read output.

According to the experimental results which will be described below, even if the thickness of the first magnetic sublayer is increased, the decrease in the rate of change in resistance (ΔR/R) or the change in resistance (ΔRs) can be appropriately reduced compared to the conventional case. Furthermore, the unidirectional exchange bias magnetic field (Hex*) can be increased, and the inclination angle of the magnetization of the second magnetic sublayer can be brought closer to 0 degrees.

In another aspect of the present invention, a magnetic sensing element includes an antiferromagnetic layer, a pinned magnetic layer, a nonmagnetic material layer, and a free magnetic layer, the magnetization direction of the free magnetic layer being aligned in a direction substantially perpendicular to the magnetization direction of the pinned magnetic layer. The antiferromagnetic layer and the pinned magnetic layer correspond to any one of the exchange coupled magnetic films described above.

In another aspect of the present invention, a magnetic sensing element includes an antiferromagnetic exchange bias layer, a free magnetic layer, a nonmagnetic material layer, a pinned magnetic layer, and an antiferromagnetic layer, the magnetization direction of the free magnetic layer being aligned in a direction substantially perpendicular to the magnetization direction of the pinned magnetic layer. A ferromagnetic layer in contact with the antiferromagnetic exchange bias layer and a nonmagnetic interlayer, which is placed between the ferromagnetic layer and the free magnetic layer, are placed between the antiferromagnetic exchange bias layer and the free magnetic layer, the ferromagnetic layer, the nonmagnetic interlayer, and the free magnetic layer forming a laminated ferrimagnetic structure. The ferromagnetic layer corresponds to the first magnetic sublayer and the free magnetic layer corresponds to the second magnetic sublayer according to any one of the exchange coupled magnetic films described above.

Preferably, the antiferromagnetic layer and the pinned magnetic layer correspond to any one of the exchange coupled magnetic films described above.

In another aspect of the present invention, a magnetic sensing element includes a free magnetic layer, an upper nonmagnetic material layer placed on the free magnetic layer, a lower nonmagnetic material layer placed under the free magnetic layer, an upper pinned magnetic layer placed on the upper nonmagnetic material layer, a lower pinned magnetic layer placed under the lower nonmagnetic material layer, an upper antiferromagnetic layer placed on the upper pinned magnetic layer, a lower antiferromagnetic layer placed under the lower pinned magnetic layer, and a seed layer placed under the lower antiferromagnetic layer, the magnetization direction of the free magnetic layer being aligned in a direction substantially perpendicular to the magnetization direction of the upper pinned magnetic layer and the lower pinned magnetic layer. The upper antiferromagnetic layer and the upper pinned magnetic layer correspond to any one of the exchange coupled films described above, and the lower antiferromagnetic layer and the lower pinned magnetic layer correspond to any one of the exchange coupled films described above.

In accordance with the magnetic sensing element in this aspect of the present invention, for example, the unidirectional exchange bias magnetic field (Hex*) in the pinned magnetic layer having a laminated ferrimagnetic structure can be increased appropriately, the rate of change in resistance (ΔR/R) can be improved, and it is possible to manufacture a magnetic sensing element which is suitable for higher recording densities.

DESCRIPTION OF THE PREFERRED EMBODIMENTS

Figure 1:
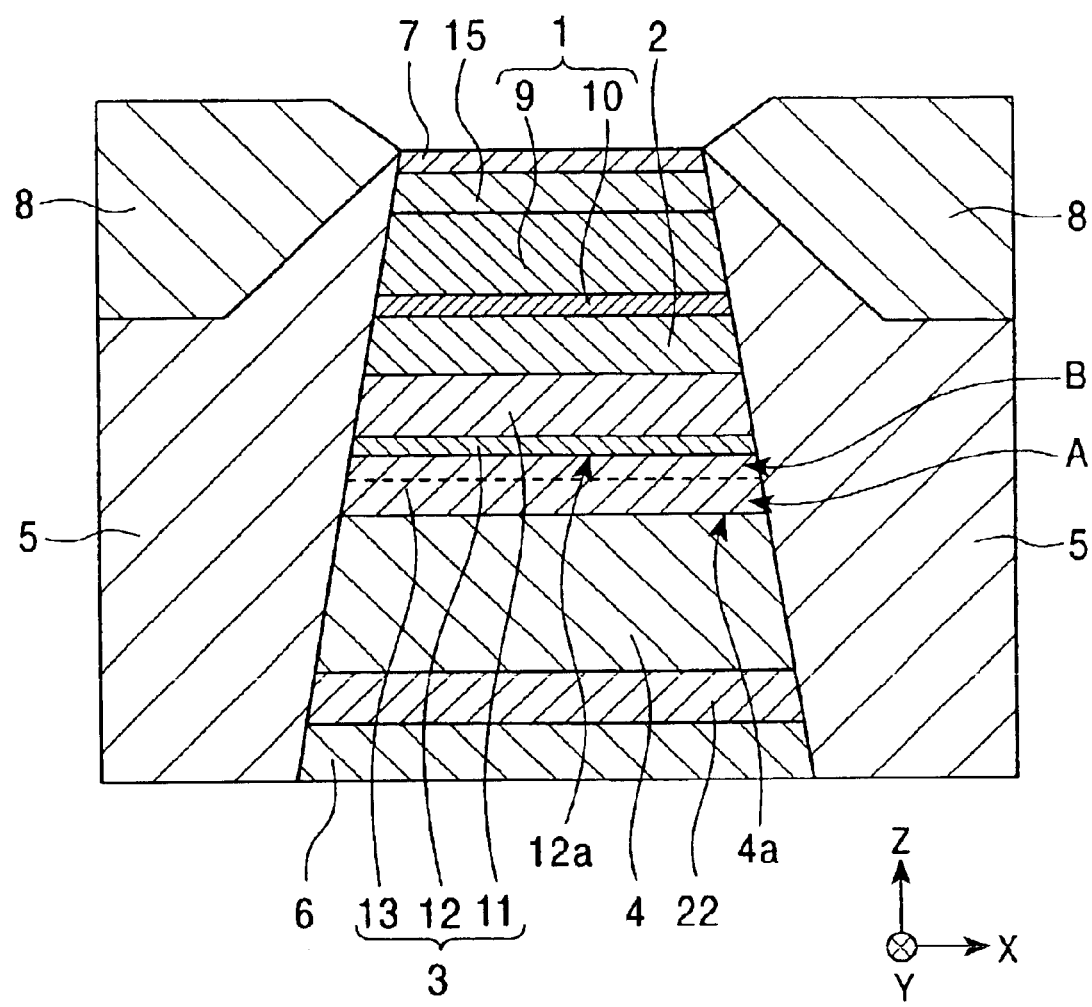
FIG. 1 is a sectional view showing the structure of a magnetic sensing element (single spin-valve magnetoresistive element) in a first embodiment of the present invention, viewed from the surface facing a recording medium.

FIG. 1 is a partial sectional view showing the overall structure of a magnetic sensing element (single spin-valve magnetoresistive element) in a first embodiment of the present invention, viewed from the surface facing a recording medium. FIG. 1 shows only the central section of the element extending in the X direction.

The single spin-valve magnetoresistive element is mounted on the training end of a floating-type slider of a hard disk drive or the like to detect magnetic fields recorded on a hard disk or the like. The magnetic recording medium, such as a hard disk, travels in the Z direction, and a leakage magnetic field from the magnetic recording medium is applied in the Y,direction.

As shown in FIG. 1, an underlayer 6 composed of a nonmagnetic material, such as at least one element selected from the group consisting of Ta, Hf, Nb, Zr, Ti, Mo, and W, is placed on the bottom. The underlayer 6 has a thickness of, for example, approximately 50 Å.

A seed layer 22 is formed on the underlayer 6. By forming the seed layer 22, the crystal grain sizes of the individual layers formed above the seed layer 22, in a direction parallel to the planes, can be increased, and current-carrying reliability, such as electromigration resistance, can be improved more appropriately, and also the rate of change in resistance ($\Delta R/R$) can be improved more appropriately.

The seed layer 22 is composed of a NiFeCr alloy or Cr. When the seed layer 22 is composed of the NiFeCr alloy, the composition thereof is, for example, $(Ni_{0.8}Fe_{0.2})_{60at\%} Cr_{40at\%}$.

An antiferromagnetic layer 4 formed on the seed layer 22 is preferably composed of an antiferromagnetic material containing X and Mn, wherein X is at least one element selected from the group consisting of Pt, Pd, Ir, Rh, Ru, and Os.

The X—Mn alloys containing such platinum group elements have excellent characteristics as antiferromagnetic materials because they exhibit superior corrosion resistance and high blocking temperatures and can generate large exchange coupling magnetic fields (Hex). In particular, Pt is preferable among the platinum group elements. For example, a binary PtMn alloy may be used.

In the present invention, the antiferromagnetic layer 4 may be composed of an antiferromagnetic material containing X, X', and Mn, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Sn, Hf, Ta, W, Re, Au, Pb, and rare-earth elements.

Preferably, an element or elements which form a solid solution by entering the interstices in the space lattice composed of X and Mn (an interstitial solid solution) or by partially replacing the lattice points in the crystal lattice composed of X and Mn (a substitutional solid solution) are used as X'. Herein, the term "solid solution" refers to a solid in which its components are homogeneously mixed over wide ranges.

The X—Mn—X' alloy as the interstitial or substitutional solid solution has a larger lattice constant compared with that of the X—Mn alloy. As a result, the difference between the lattice constant of the antiferromagnetic layer 4 and that of a pinned magnetic layer 3 can be increased so that a non-coherent state is brought about easily in the interface structure between the antiferromagnetic layer 4 and the pinned magnetic layer 3. Herein, the term "non-coherent state" refers to a state in which the atoms constituting the antiferromagnetic layer 4 and the atoms constituting the pinned magnetic layer 3 do not exhibit one-to-one correspondence at the interface between the antiferromagnetic layer 4 and the pinned magnetic layer 3.

When an element or elements which form a substitutional solid solution are used as X', if the X' content becomes excessive, the antiferromagnetic characteristics are degraded, and the magnitude of the exchange coupling magnetic field (Hex) generated at the interface with the pinned magnetic layer 3 is decreased. In the present invention, X' is preferably at least one inert rare gas element selected from the group consisting of Ne, Ar, Kr, and Xe which forms an interstitial solid solution. Since rare gas elements are inert, these gases do not substantially affect the antiferromagnetic characteristics even when they are contained in the layers. Moreover, for example, Ar, which is commonly used as a sputtering gas in sputtering apparatuses, can readily enter the layer by simply adjusting the gas pressure properly.

When a gaseous element or elements are used as X', it is difficult for the layer to contain a large amount of the element X'. However, these rare gases can remarkably increase the exchange coupling magnetic field (Hex) generated by annealing even in a small amount.

In the present invention, the X' content is preferably 0.2 to 10 atomic percent, and more preferably, 0.5 to 5 atomic percent. Since Pt is preferred as X in the present invention, a Pt—Mn—X' alloy is preferably used.

In the present invention, the X content or the X+X' content in the antiferromagnetic layer 4 is preferably in the range of 45 to 60 atomic percent, and more preferably, in the range of 49 to 56.5 atomic percent. Consequently, the interface with the pinned magnetic layer 3 is put into a non-coherent state during deposition, and the antiferromagnetic layer 4 can achieve an adequate order transformation by annealing.

The pinned magnetic layer 3 formed on the antiferromagnetic layer 4 has a three-layered structure.

The pinned magnetic layer 3 includes a first magnetic sublayer 13 in contact with the antiferromagnetic layer 4, an intermediate nonmagnetic sublayer 12 placed on the first magnetic sublayer 13, and a second magnetic sublayer 11 placed on the intermediate nonmagnetic sublayer 12.

The materials and layer structure of the pinned magnetic layer 3 will be described in detail later.

A nonmagnetic material layer 2 is formed on the pinned magnetic layer 3. The nonmagnetic material layer 2 is, for example, composed of Cu. When the magnetic sensing element of the present invention is applied to a tunneling magnetoresistive element (TMR element) utilizing the tunneling effect, the nonmagnetic material layer 2 is composed of an insulating material, such as $Al_2O_3$.

A free magnetic layer 1 having a two-layered structure is formed on the nonmagnetic material layer 2.

The free magnetic layer 1 includes a NiFe alloy sublayer 9 and a CoFe alloy sublayer 10. As shown in FIG. 1, by forming the CoFe alloy sublayer 10 on the side in contact with the nonmagnetic material layer 2, diffusion of metallic elements, etc. can be prevented at the interface with the nonmagnetic material layer 2, and the rate of change in resistance ($\Delta R/R$) can be increased.

The NiFe alloy sublayer 9, for example, contains 80 atomic percent of Ni and 20 atomic percent of Fe. The CoFe alloy sublayer 10, for example, contains 90 atomic percent of Co and 10 atomic percent of Fe. For example, the NiFe alloy sublayer 9 has a thickness of approximately 45 Å, and the CoFe alloy sublayer 10 has a thickness of approximately 5 Å. The sublayers may be composed of Co alloys, CoFeNi alloys, or the like, instead of the NiFe alloy and the CoFe alloy. The free magnetic layer 1 may have a single-layered structure, and in such a case, the free magnetic layer 1 is preferably composed of a CoFeNi alloy.

The free magnetic layer 1 may have a laminated ferrimagnetic structure in which a nonmagnetic intermediate sublayer is placed between magnetic sublayers.

A back layer 15 composed of a metal or nonmagnetic metal, such as Cu, Au, or Ag, is formed on the free magnetic layer 1. For example, the thickness of the back layer 15 is approximately 5 to 20 Å.

A protective layer 7 is formed on the back layer 15. The protective layer 7 is composed of Ta or the like, and preferably, the surface thereof is oxidized to form an oxide layer (specular reflection layer).

By forming the back layer 15, the mean free path of electrons with positive spins (spin-up electrons) which contribute to the magnetoresistance effect can be extended, and a large rate of change in resistance can be obtained in the spin-valve magnetic element because of a so-called "spin filter effect", and thus the magnetic element becomes suitable for higher recording densities. Additionally, the back layer 15 may be omitted.

In the embodiment shown in FIG. 1, hard bias layers 5 and electrode layers 8 are formed at both side of the laminated film including the underlayer 6 to the protective layer 7. The magnetization of the free magnetic layer 1 is aligned in the track width direction (in the X direction in the drawing) by a longitudinal magnetic field from the hard bias layers 5.

The hard bias layers 5 are composed of a Co—Pt alloy, a Co—Cr—Pt alloy, or the like. The electrode layers 8 are composed of $\alpha$-Ta, Au, Ru, Cr, Cu, W, or the like. Additionally, in the tunneling magnetoresistive element described above or a magnetic sensing element of a current-perpendicular-to-the-plane (CPP) type, one of the electrode layers 8 is formed above the free magnetic layer 1 and the other is formed below the antiferromagnetic layer 4.

In this embodiment, as described above, the pinned magnetic layer 3 has a laminated ferrimagnetic structure.

The first magnetic sublayer 13 in contact with the antiferromagnetic layer 4 has the following layer structure.

That is, in the first magnetic sublayer 13, a magnetic region containing X, wherein X is at least one element selected from the group consisting of Cr, Ti, V, Zr, Nb, Mo, Hf, Ta, and W, extends from an interface 4a with the antiferromagnetic layer 4 toward the nonmagnetic intermediate sublayer 12 (in the Z direction), and a magnetic region not containing X extends from an interface 12a with the nonmagnetic intermediate sublayer 12 toward the antiferromagnetic layer 4 (in a direction opposite to the Z direction).

As schematically shown in FIG. 1, the first magnetic sublayer 13 is divided into a region A and a region B by the dotted line. The region A on the antiferromagnetic layer 4 side is composed of a magnetic material containing X, and the region B on the nonmagnetic intermediate sublayer 12 side is composed of a magnetic material not containing X.

The borderline between the regions A and B is provided for convenience sake. Actually, as will be described below, the first magnetic sublayer 13 has a composition gradient with respect to X, and therefore, the borderline does not distinguish clearly between the presence and absence of X.

Specifically, in the present invention, the region A on the antiferromagnetic layer 4 side is preferably composed of a CoFeX alloy, and the region B on the nonmagnetic intermediate sublayer 12 side is preferably composed of a CoFe alloy.

When the region A containing X lies on the antiferromagnetic layer 4 side, the resistivity in the region A is larger than the resistivity in the region B not containing X.

As will be shown in the experimental results described below, if the antiferromagnetic layer 4 and the region A containing X are brought into contact with each other, the exchange coupling magnetic field (Hex) generated between the antiferromagnetic layer 4 and the region A can be increased.

On the other hand, if the nonmagnetic intermediate sublayer 12 and the region B not containing X are brought into contact with each other, the coupling magnetic field due to the RKKY interaction generated between the region B and the second magnetic sublayer 11 can be increased.

Therefore, it is possible to appropriately increase the unidirectional exchange bias magnetic field (Hex*) which is the combination of the exchange coupling magnetic field (Hex) primarily generated between the antiferromagnetic layer 4 and the region A and the coupling magnetic field due to the RKKY interaction.

Moreover, since the region A containing X having a high resistivity lies in the first magnetic sublayer 13, it is possible to decrease the amount of shunting of the sensing current flowing from the electrode layer 8, and thus, the so-called "shunt loss" can be decreased, and the rate of change in resistance (ΔR/R) can be improved.

That is, in the present invention, an improvement in the unidirectional exchange bias magnetic field (Hex*) and an improvement in the rate of change in resistance (ΔR/R) can be simultaneously achieved, which was not possible in the conventional technique.

If the unidirectional exchange bias magnetic field (Hex*) is increased, the first magnetic sublayer 13 and the second magnetic sublayer 11 of the pinned magnetic layer 3 can be pinned appropriately. As a result, current-carrying reliability, such as ESD resistance and electromigration resistance, can be improved.

As described above, in accordance with the present invention, an improvement in current-carrying reliability and an improvement in the rate of change in resistance can be achieved simultaneously, and it is possible to manufacture a magnetic sensing element which is suitable for higher recording densities.

The materials for the first magnetic sublayer 13 will now be described below. In the present invention, as described above, preferably, the region A containing X is composed of a CoFeX alloy and the region B not containing X is composed of a CoFe alloy. The reason for this is that by forming the first magnetic sublayer 13 with magnetic materials containing CoFe alloys as major ingredients, the exchange coupling magnetic field (Hex) generated between the first magnetic sublayer 13 and the antiferromagnetic layer 4 and the coupling magnetic field due to the RKKY interaction can be increased, and the magnetization of the first magnetic sublayer 13 can be pinned appropriately.

However, the materials for the first magnetic sublayer 13 are not limited to the magnetic materials containing CoFe alloys as major ingredients. For example, the first magnetic sublayer 13 may be composed of magnetic materials containing NiFe alloys as major ingredients. In such a case, the region A containing X is composed of a NiFeX alloy, and the region B not containing X is composed of a NiFe alloy. Alternatively, the first magnetic sublayer 13 may be composed of magnetic materials containing CoFeNi alloys or Co as major ingredients. In such a case, the region A containing X is composed of a CoFeNiX alloy or a CoX alloy, and the region B not containing X is composed of a CoFeNi alloy or Co.

Preferably, Cr is selected as X. Consequently, the resistivity of the region A of the first magnetic sublayer 13 can be increased appropriately, and a large exchange coupling magnetic field (Hex) can be generated between the first magnetic sublayer 13 and the antiferromagnetic layer 4. In the magnetic layer composed of the CoFeCr alloy, it is possible to obtain a resistivity of approximately 50 μΩ·cm.

Preferably, the X content is in the range of 3 to 15 atomic percent. If the X content is less than 3 atomic percent, the resistivity in the region A containing X cannot be increased appropriately, and the rate of change in resistance (ΔR/R) cannot be improved.

If the X content is more than 15 atomic percent, the exchange coupling magnetic field (Hex) generated between the pinned magnetic layer 3 and the antiferromagnetic layer 4 is decreased, and as a result, the unidirectional exchange bias magnetic field (Hex*) is decreased.

When the first magnetic sublayer 13 is composed of magnetic materials containing CoFe alloys as major ingredients, the Co/Fe atomic ratio is preferably in the range of 85/15 to 96/4. Consequently, the face-centered cubic structure of the first magnetic sublayer 13 becomes stable, and the crystal orientation of the layers located above the first magnetic sublayer 13 is not adversely affected.

The second magnetic sublayer 11 is preferably composed of a CoFe alloy. Consequently, the coupling magnetic field due to the RKKY interaction between the second magnetic sublayer 11 and the first magnetic sublayer 13 can be increased, and the magnetization of the second magnetic sublayer 11 can be pinned appropriately.

In the present invention, the material for the second magnetic sublayer 11 is not limited to the CoFe alloy, the second magnetic sublayer 11 may be composed of a magnetic material, such as a CoFeNi alloy, Co, or a NiFe alloy.

Since the pinned magnetic layer 3 has a laminated ferrimagnetic structure, in order to obtain a laminated ferrimagnetic state appropriately, the magnetic moment (saturation magnetization Ms×thickness t) per unit area of the first magnetic sublayer 13 must be set to be different from the magnetic moment per unit area of the second magnetic sublayer 11.

Consequently, the antiparallel state between the magnetizations of the first magnetic sublayer 13 and the second magnetic sublayer 11 can be bought about appropriately by the coupling magnetic field due to the RKKY interaction between the first magnetic sublayer 13 and the second magnetic sublayer 11. Additionally, the appropriate range of the magnetic moment difference (Net Mst), which is obtained by subtracting the magnetic moment per unit area of the first magnetic sublayer 13 from the magnetic moment per unit area of the second magnetic sublayer 11, will be described below.

The nonmagnetic intermediate sublayer 12 placed between the first magnetic sublayer 13 and the second magnetic sublayer 11 is preferably composed of at least one element selected from the group consisting of Ru, Rh, Ir, Os, Cr, Re, and Cu. More preferably, the nonmagnetic intermediate sublayer 12 is composed of Ru. Consequently, the coupling magnetic field due to the RKKY interaction between the first magnetic sublayer 13 and the second magnetic sublayer 11 can be increased, and the magnetizations of the first magnetic sublayer 13 and the second magnetic sublayer 11 can be in an antiparallel state appropriately.

In the present invention, as will be described below in conjunction with the manufacturing method, the antiferromagnetic layer 4 is composed of an antiferromagnetic material, such as a PtMn alloy, which can generate an exchange coupling magnetic field (Hex) between the antiferromagnetic layer 4 and the first magnetic sublayer 13 by annealing.

In order to form the first magnetic sublayer 13 of the pinned magnetic layer 3, for example, after the region A containing X, preferably composed of a CoFeX alloy, is formed on the antiferromagnetic layer 4 by sputtering, the region B not containing X, preferably composed of a CoFe alloy, is formed thereon by sputtering.

When annealing treatment is performed, X thermally diffuses at the boundary between the region A and the region B. Thereby, X enters into the region B, and the X content in the region A in the vicinity of the boundary with the region B is decreased. That is, by annealing, a region which generates a composition gradient with respect to X is formed.

Therefore, in this embodiment, in the first magnetic sublayer 13, there is a region in which the X content gradually decreases from the interface 4a side to the interface 12a side.

It is difficult to clearly observe the borderline between the region A containing X and the region B not containing X, and the border area has the composition gradient with respect to X.

The thickness of the first magnetic sublayer 13 will now be described below. In this embodiment, the thickness of the first magnetic sublayer 13 is preferably in the range of 10 to 20 Å. In the first magnetic sublayer 13, preferably, the region in which the X content is less than 3 atomic percent (in which the X content in the vicinity of the interface 12a with the nonmagnetic intermediate sublayer 12 is 0 atomic percent) has a thickness of 3 to 10 Å, and the region in which the X content is 3 atomic percent or more has a thickness of 3 to 15 Å.

Consequently, the exchange coupling magnetic field (Hex) generated between the first magnetic sublayer 13 and the antiferromagnetic layer 4 can be increased, and the coupling magnetic field due to the RKKY interaction between the first magnetic sublayer 13 and the second magnetic sublayer 11 can be increased. As a result, the unidirectional exchange bias magnetic field (Hex*) in the pinned magnetic layer 3 can be increased appropriately.

If the proportion of the thickness of the region in which the X content is 3 atomic percent or more to the total thickness of the first magnetic sublayer 13 is greater than 0% and less than or equal to 85%, the amount of shunting of the sensing current into the first magnetic sublayer 13 can be appropriately reduced, and thus, the so-called "shunt loss" can be decreased, and the rate of change in resistance ($\Delta R/R$) can be improved appropriately.

When the region containing X is composed of a CoFeX alloy and the region not containing X is composed of a CoFe alloy, preferably, the ratio of the thickness of the CoFeX alloy region to the total thickness of the first magnetic sublayer 13 is greater than 0 and less than or equal to 0.61. Consequently, the rate of change in resistance can be increased and also the plateau magnetic field (Hpl) can be increased compared with the conventional case (in which the first magnetic sublayer is composed of a CoFe alloy or CoFeX alloy alone).

Figure 13:
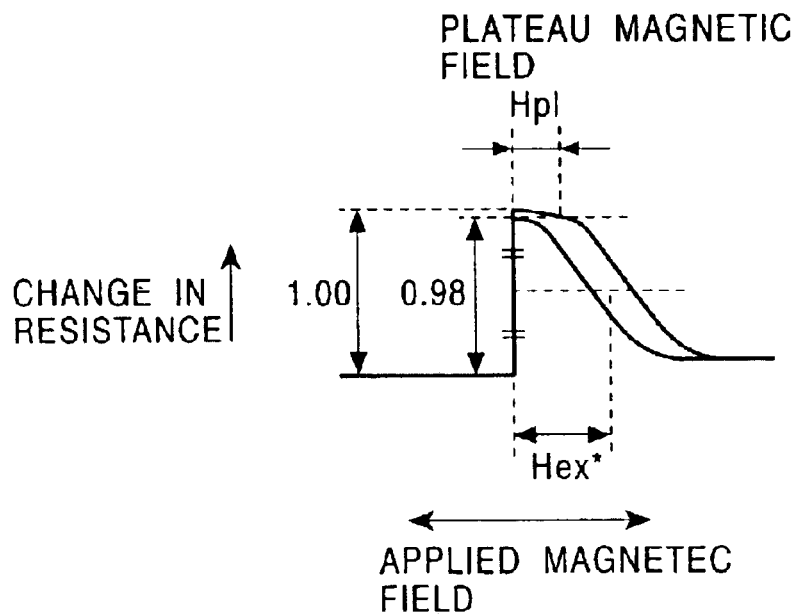
FIG. 13 is a schematic diagram of a hysteresis loop illustrating the plateau magnetic field.

Herein, the plateau magnetic field (Hpl) is the magnitude of an applied magnetic field at which the rate of change in resistance is 0.98 in relation to the maximum value (1.00) as shown in the hysteresis loop in FIG. 13. If the plateau magnetic field is large, the antiparallel state of the magnetizations of the first magnetic sublayer 13 and the second magnetic sublayer 11 is maintained stably. Therefore, a larger plateau magnetic field is preferred.

In this embodiment of the present invention, preferably, the ratio of the thickness of the CoFeX alloy region to the total thickness of the first magnetic sublayer 13 is greater than 0 and less than or equal to 0.36. Consequently, the unidirectional exchange bias magnetic field (Hex*) can be increased and also the plateau magnetic field (Hpl) can be increased compared to the conventional case. Moreover, the rate of change in resistance ($\Delta R/R$) can be increased compared to the conventional case.

In this embodiment, preferably, the ratio of the thickness of the CoFeX alloy region to the total thickness of the first magnetic sublayer 13 is in the range of 0.26 to 0.82. Consequently, a rate of change in resistance of 15.25% or more can be obtained, and the plateau magnetic field (Hpl) can be increased compared to the conventional case.

In this embodiment, preferably, the ratio of the thickness of the CoFeX alloy region to the total thickness of the first magnetic sublayer 13 is in the range of 0.12 to 0.61. Consequently, the rate of change in resistance ($\Delta R/R$) can be increased compared to the conventional case, and a plateau magnetic field (Hpl) of 30 kA/m or more can be obtained.

In this embodiment, preferably, the ratio of the thickness of the CoFeX alloy region to the total thickness of the first magnetic sublayer 13 is in the range of 0.26 to 0.61. Consequently, a rate of change in resistance of 15.25% or more can be obtained, and a plateau magnetic field of 30 kA/m or more can be obtained.

Furthermore, in this embodiment, preferably, the ratio of the thickness of the CoFeX alloy region to the total thickness of the first magnetic sublayer 13 is in the range of 0.26 to 0.36. Consequently, a rate of change in resistance of 15.25% or more can be obtained, a plateau magnetic field of 30 kA/m or more can be obtained, and the unidirectional exchange bias magnetic field (Hex*) can be increased compared to the conventional case.

In the embodiment described above, the region not containing X is present in the vicinity of the interface 12a with the nonmagnetic intermediate sublayer 12. Even if the entire region of the first magnetic sublayer 13 contains X, if the film composition described below is satisfied, the unidirectional exchange bias magnetic field (Hex*) in the pinned magnetic layer 3 can be increased appropriately in the present invention.

That is, an embodiment of the present invention may be provided, in which the X content in the vicinity of the interface 4a between the first magnetic sublayer 13 and the antiferromagnetic layer 4 is higher than the X content in the vicinity of the interface 12a between the first magnetic sublayer 13 and the nonmagnetic intermediate sublayer 12.

In this embodiment, since a slight amount of X is contained even in the vicinity of the interface 12a, X is contained in the entire first magnetic sublayer 13.

However, in the vicinity of the interface 12a between the first magnetic sublayer 13 and the nonmagnetic intermediate sublayer 12, the X content is small, and preferably, less than 3 atomic percent. Consequently, the coupling magnetic field due to the RKKY interaction with an appropriate magnitude can be generated.

In the interface 4a side of the first magnetic sublayer 13, the X content is large, and preferably, in the range of 3 atomic percent to 15 atomic percent. Consequently, the exchange coupling magnetic field (Hex) with an appropriate magnitude can be generated between the first magnetic sublayer 13 and the antiferromagnetic layer 4.

Therefore, with respect to the film composition described above, it is also possible to increase the unidirectional exchange bias magnetic field (Hex*) in the pinned magnetic layer 3, the pinned magnetic layer 3 can be pinned appropriately, and current-carrying reliability, such as ESD resistance and electromigration resistance, can be improved.

Moreover, since the first magnetic sublayer 13 is the region containing X having a high resistivity, it is possible to decrease the amount of shunting of the sensing current flowing from the electrode layer 8, and thus, the so-called "shunt loss" can be decreased, and the rate of change in resistance ($\Delta R/R$) can be improved.

Figure 2:
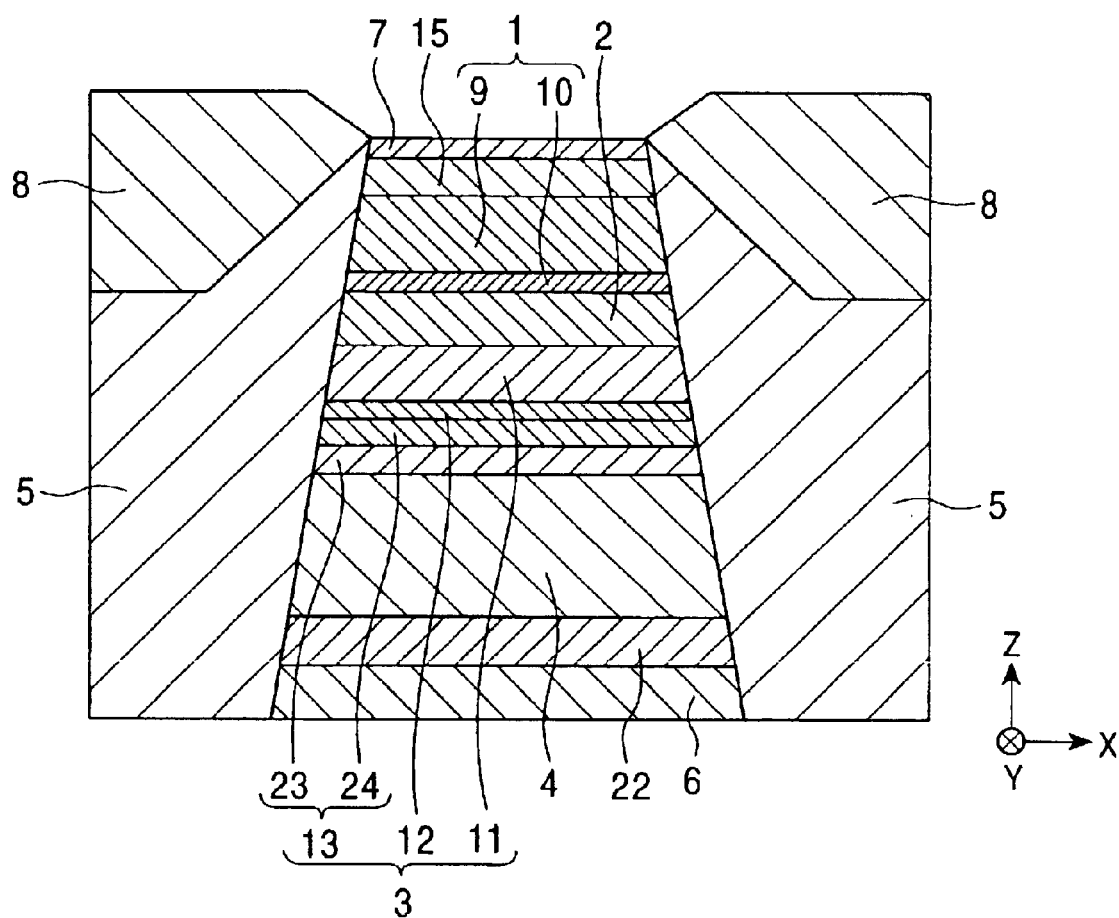
FIG. 2 is a sectional view showing the structure of a magnetic sensing element (single spin-valve magnetoresistive element) in a second embodiment of the present invention, viewed from the surface facing a recording medium.

FIG. 2 is a sectional view showing a magnetic sensing element in a second embodiment of the present invention. In the magnetic sensing element shown in FIG. 2, the first magnetic sublayer 13 has a two-layered structure including a magnetic zone 23 and a magnetic zone 24.

In this embodiment, the magnetic zone 23 in contact with the antiferromagnetic layer 4 is composed of a magnetic material containing X, wherein X is at least one element selected from the group consisting of Cr, Ti, V, Zr, Nb, Mo, Hf, Ta, and W, and the magnetic zone 24 in contact with the nonmagnetic intermediate sublayer 12 is composed of a magnetic material not containing X.

In this embodiment, preferably, the magnetic zone 23 is composed of a CoFeX alloy and the magnetic zone 24 is composed of a CoFe alloy.

In this embodiment, since the magnetic zone 23 containing X having a high resistivity is formed on the side in contact with the antiferromagnetic layer 4, the magnitude of the exchange coupling magnetic field (Hex) generated between the antiferromagnetic layer 4 and the magnetic zone 23 can be increased compared with the case in which a magnetic zone not containing X is formed in contact with the antiferromagnetic layer 4.

Since the magnetic zone 24 not containing X having a low resistivity is formed on the side in contact with the nonmagnetic intermediate sublayer 12, the magnitude of the coupling magnetic field due to the RKKY interaction generated between the first magnetic sublayer 13 and the second magnetic sublayer 11 can be increased compared with the case in which a magnetic zone containing X is formed in contact with the nonmagnetic intermediate sublayer 12.

Consequently, the unidirectional exchange bias magnetic field (Hex*) in the pinned magnetic layer 3 can be appropriately increased compared to the conventional case, and the pinned magnetic layer 3 can be pinned appropriately. As a result, current-carrying reliability, such as ESD resistance and electromigration resistance, can be improved.

Moreover, in this embodiment, since the magnetic zone 23 containing X having a high resistivity is formed in the first magnetic sublayer 13, it is possible to decrease the amount of shunting of the sensing current flowing from the electrode layer 8 into the first magnetic sublayer 13, and thus, the so-called "shunt loss" can be decreased, and the rate of change in resistance ($\Delta R/R$) can be improved.

As described above, in this embodiment, the unidirectional exchange bias magnetic field (Hex*) in the pinned magnetic layer 3 can be increased, current-carrying reliability can be improved, and the rate of change in resistance ($\Delta R/R$) can also be improved. Therefore, it is possible to manufacture a magnetic sensing element which is suitable for higher recording densities.

This embodiment differs from the first embodiment shown in FIG. 1 in that the first magnetic sublayer 13 has the two-layered structure. Although the first magnetic sublayer 13 in the first embodiment has a two-layered structure in the film formation step, thermal diffusion occurs between two magnetic regions when annealing treatment is performed in a magnetic field, and therefore, the first magnetic sublayer 13 in the first embodiment is completed so as to have substantially a single-layered structure.

On the other hand, in the embodiment shown in FIG. 2, the first magnetic sublayer 13 is completed so as to have a two-layered structure including the magnetic zones 23 and 24. The reason for this is that, for example, an antiferromagnetic material which can generate an exchange coupling magnetic field (Hex) between the antiferromagnetic layer 4 and the magnetic zone 23 constituting the first magnetic sublayer 13 without annealing treatment may be used. Alternatively, even if annealing treatment must be performed, the annealing conditions are insufficient to cause thermal diffusion between the magnetic zones 23 and 24.

Additionally, although the first magnetic sublayer 13 has the two-layered structure in the embodiment shown in FIG. 2, the number of layers constituting the first magnetic sublayer 13 may be three or more. In such a case, the magnetic zone in contact with the interface with the antiferromagnetic layer 4 is composed of a material containing X, for example, a CoFeX alloy, and the magnetic zone in contact with the interface with the nonmagnetic intermediate sublayer 12 is composed of a material not containing X, for example, a CoFe alloy.

In the embodiment shown in FIG. 2, the thickness of the magnetic zone 23 containing X is preferably in the range of 3 to 15 Å, and the thickness of the magnetic zone 24 not containing X is preferably in the range of 3 to 15 Å. The proportion of the thickness of the magnetic zone 23 to the total thickness of the first magnetic sublayer 13 is preferably greater than 0 and less than or equal to 85%.

Preferably, the X content is in the range of 3 to 15 atomic percent. Consequently, the exchange coupling magnetic field (Hex) generated between the first magnetic sublayer 13 and the antiferromagnetic layer 4 can be increased, and the coupling magnetic field due to the RKKY interaction between the first magnetic sublayer 13 and the second magnetic sublayer 11 can be increased. As a result, the unidirectional exchange bias magnetic field (Hex*) in the pinned magnetic layer 3 can be increased appropriately, and also the amount of shunting of the sensing current into the first magnetic sublayer 13 can be decreased, resulting in an increase in the rate of change in resistance ($\Delta R/R$).

When the magnetic zone 23 containing X is composed of a CoFeX alloy and the magnetic zone 24 not containing X is composed of a CoFe alloy, preferably, the ratio of the thickness of the magnetic zone 23 composed of the CoFeX alloy to the total thickness of the first magnetic sublayer 13 is greater than 0 and less than or equal to 0.61. Consequently, the rate of change in resistance can be increased and also the plateau magnetic field (Hpl) can be increased compared with the conventional case (in which the first magnetic sublayer is composed of a CoFe alloy or CoFeX alloy alone).

In this embodiment of the present invention, preferably, the ratio of the thickness of the magnetic zone 23 composed of the CoFeX alloy to the total thickness of the first magnetic sublayer 13 is greater than 0 and less than or equal to 0.36. Consequently, the unidirectional exchange bias magnetic field (Hex*) can be increased and also the plateau magnetic field (Hpl) can be increased compared to the conventional case. Moreover, the rate of change in resistance ($\Delta R/R$) can be increased compared to the conventional case.

In this embodiment, preferably, the ratio of the thickness of the magnetic zone 23 composed of the CoFeX alloy to the total thickness of the first magnetic sublayer 13 is in the range of 0.26 to 0.82. Consequently, a rate of change in resistance of 15.25% or more can be obtained, and the plateau magnetic field (Hpl) can be increased compared to the conventional case.

In this embodiment, preferably, the ratio of the thickness of the magnetic zone 23 composed of the CoFeX alloy to the total thickness of the first magnetic sublayer 13 is in the range of 0.12 to 0.61. Consequently, the rate of change in resistance ($\Delta R/R$) can be increased compared to the conventional case, and a plateau magnetic field (Hpl) of 30 kA/m or more can be obtained.

In this embodiment, preferably, the ratio of the thickness of the magnetic zone 23 composed of the CoFeX alloy to the total thickness of the first magnetic sublayer 13 is in the range of 0.26 to 0.61. Consequently, a rate of change in resistance of 15.25% or more can be obtained, and a plateau magnetic field of 30 kA/m or more can be obtained.

Furthermore, in this embodiment, preferably, the ratio of the thickness of the magnetic zone 23 composed of the CoFeX alloy to the total thickness of the first magnetic sublayer 13 is in the range of 0.26 to 0.36. Consequently, a rate of change in resistance of 15.25% or more can be obtained, a plateau magnetic field of 30 kA/m or more can be obtained, and the unidirectional exchange bias magnetic field (Hex*) can be increased compared to the conventional case.

The construction of the first magnetic sublayer 13 constituting the pinned magnetic layer 3 having the laminated ferrimagnetic structure shown in FIG. 1 or 2, which has been described above in detail, may be applied to a magnetic sensing element having a structure other than the above.

Figure 3:
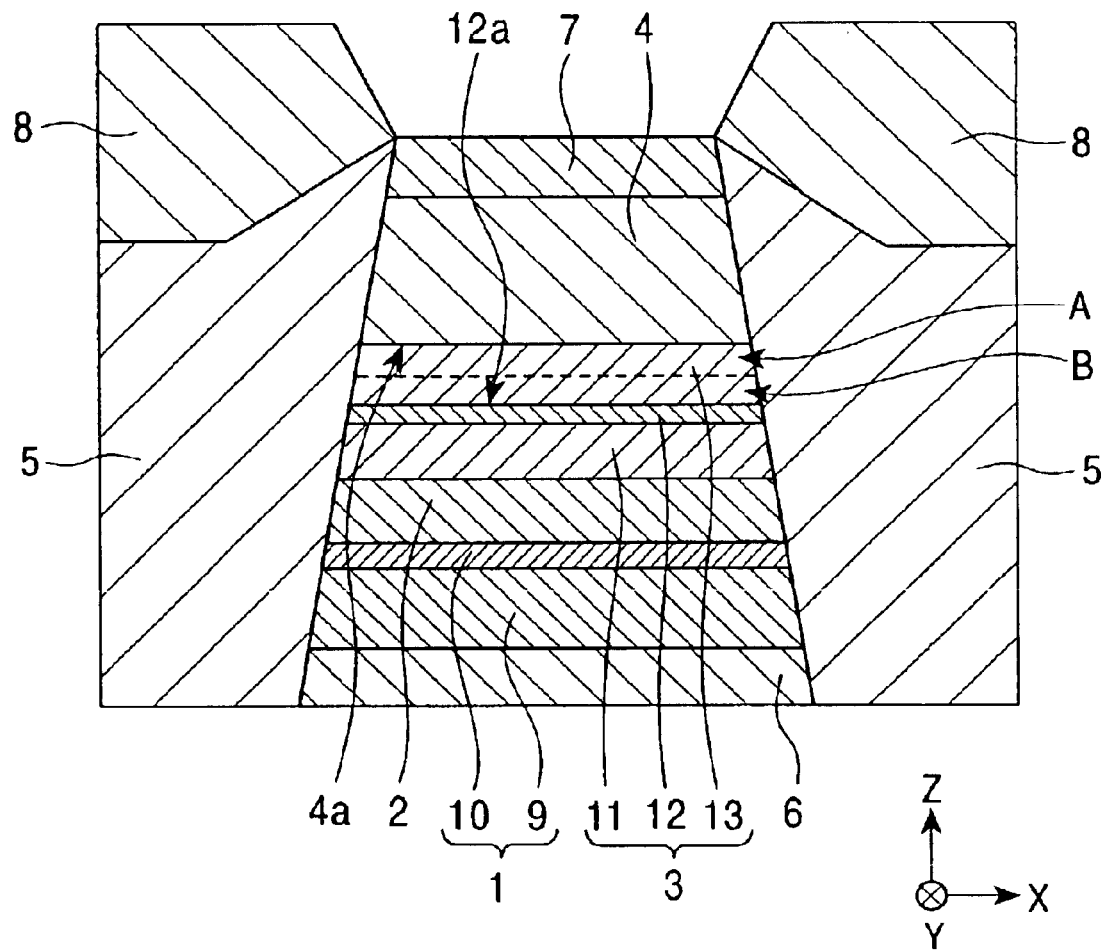
FIG. 3 is a sectional view showing the structure of a magnetic sensing element (single spin-valve magnetoresistive element) in a third embodiment of the present invention, viewed from the surface facing a recording medium.

FIG. 3 is a sectional view showing the structure of a magnetic sensing element (single spin-valve magnetoresistive element) in a third embodiment of the present invention, viewed from the surface facing a recording medium. The same layers as those in FIGS. 1 and 2 are represented by the same reference numerals.

In the magnetic sensing element shown in FIG. 3, the free magnetic layer 1 is formed below the antiferromagnetic layer 4, and the order in the laminated structure is reverse to that in FIG. 1 or 2.

Referring to FIG. 3, the pinned magnetic layer 3 has a three-layered structure including the first magnetic sublayer 13, the nonmagnetic intermediate sublayer 12, and the second magnetic sublayer 11.

In this embodiment, the first magnetic sublayer 13, which is in contact with the antiferromagnetic layer 4, also includes a region A composed of a magnetic material containing X placed on the antiferromagnetic layer 4 side and a region B composed of a magnetic material not containing X placed on the nonmagnetic intermediate sublayer 12 side.

Preferably, the region A is composed of a CoFeX alloy and the region B is composed of a CoFe alloy.

If the first magnetic sublayer 13 has the film construction described above, the exchange coupling magnetic field (Hex) generated between the antiferromagnetic layer 4 and the first magnetic sublayer 13 can be increased, and the coupling magnetic field due to the RKKY interaction generated between the second magnetic sublayer 11 and the first magnetic sublayer 13 can be increased. As a result, the unidirectional exchange bias magnetic field (Hex*) in the pinned magnetic layer 3 can be increased.

Consequently, the pinned magnetic layer 3 can be pinned appropriately, and current-carrying reliability, such as ESD resistance and electromigration resistance, can be improved.

Moreover, in this embodiment, since the region A containing X having a high resistivity lies in the first magnetic sublayer 13, it is possible to decrease the amount of shunting of the sensing current flowing from the electrode layer 8 into the first magnetic sublayer 13, and thus, the so-called "shunt loss" can be decreased, and the rate of change in resistance ($\Delta R/R$) can be improved.

As described above, in accordance with this embodiment of the present invention, the unidirectional exchange bias magnetic field (Hex*) can be increased appropriately compared to the conventional case, current-carrying reliability can be improved, and the rate of change in resistance ($\Delta R/R$) can also be improved. Therefore, it is possible to manufacture a magnetic sensing element which is suitable for higher recording densities.

With respect to the materials other than the magnetic materials containing CoFe alloys as major ingredients used for the regions A and B of the first magnetic sublayer 13, the compositional ratios, the thickness, and the thickness ratio, the same descriptions as those for the magnetic sensing element shown in FIG. 1 or 2 are applicable to this embodiment.

Figure 4:
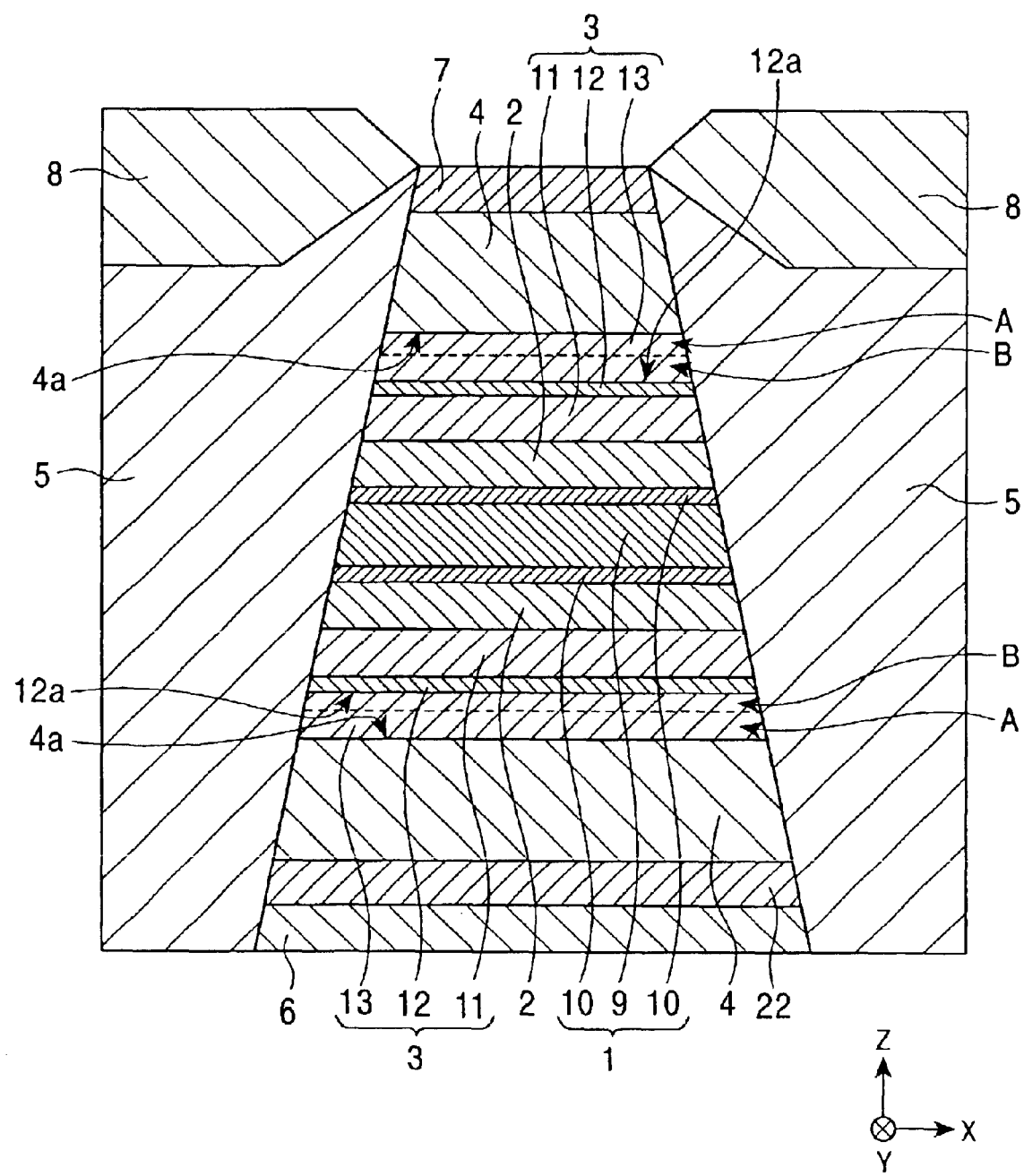
FIG. 4 is a sectional view showing the structure of a magnetic sensing element (dual spin-valve magnetoresistive element) in a fourth embodiment of the present invention, viewed from the surface facing a recording medium.

FIG. 4 is a sectional view showing the structure of a magnetic sensing element (dual spin-valve magnetoresistive element) in a fourth embodiment of the present invention, viewed from the surface facing a recording medium.

As shown in FIG. 4, in the magnetic sensing element, an underlayer 6, a seed layer 22, a lower antiferromagnetic layer 4, a lower pinned magnetic layer 3, a lower nonmagnetic material layer 2, and a free magnetic layer 1 are continuously deposited in that order from the bottom. The free magnetic layer 1 has a three-layered structure, for example, including CoFe alloy sublayers 10 and a NiFe alloy sublayer 9. An upper nonmagnetic material layer 2, an upper pinned magnetic layer 3, an upper antiferromagnetic layer 4, and a protective layer 7 are deposited in that order further on the free magnetic layer 1.

Hard bias layers 5 and electrode layers 8 are deposited at both sides of the laminated film including from the underlayer 6 to the protective layer 7. The individual layers are composed of the same materials as those described with reference to FIGS. 1 and 2.

In the magnetic sensing element shown in FIG. 4, each of the upper and lower pinned magnetic layers 3 has a three-layered structure including the first magnetic sublayer 13, the nonmagnetic intermediate sublayer 12, and the second magnetic sublayer 11 facing the first magnetic sublayer 13 with the nonmagnetic intermediate sublayer 12 therebetween.

In this embodiment, the first magnetic sublayer 13 in contact with the antiferromagnetic layer 4 also includes the region A composed of a magnetic material containing X formed on the antiferromagnetic layer 4 side and the region B composed of a magnetic material not containing X formed on the nonmagnetic intermediate sublayer 12 side.

Preferably, the region A is composed of a CoFeX alloy, and the region B is composed of a CoFe alloy.

If the first magnetic sublayer 13 has the layer structure described above, the exchange coupling magnetic field (Hex) generated between the antiferromagnetic layer 4 and the first magnetic sublayer 13 can be increased and the coupling magnetic field due to the RKKY interaction between the first magnetic sublayer 13 and the second magnetic sublayer 11 can be increased. Therefore, it is possible to appropriately increase the unidirectional exchange bias magnetic field (Hex*) in the pinned magnetic layer 3 compared to the conventional case.

Consequently, the pinned magnetic layer 3 can be pinned appropriately, and current-carrying reliability, such as ESD resistance and electromigration resistance, can be improved.

Moreover, in this embodiment, since the region A containing X having a high resistivity lies in the first magnetic sublayer 13, it is possible to decrease the amount of shunting of the sensing current flowing from the electrode layer 8 into the first magnetic sublayer 13, and thus, the so-called "shunt loss" can be decreased, and the rate of change in resistance ($\Delta R/R$) can be improved.

As described above, in accordance with this embodiment of the present invention, the unidirectional exchange bias magnetic field (Hex*) can be increased, current-carrying reliability can be improved, and the rate of change in resistance ($\Delta R/R$) can also be improved. Therefore, it is possible to manufacture a magnetic sensing element which is suitable for higher recording densities.

With respect to the materials other than the magnetic materials containing CoFe alloys as major ingredients used for the regions A and B of the first magnetic sublayer 13, the compositional ratios, the thickness, and the thickness ratio, the same descriptions as those for the magnetic sensing element shown in FIG. 1 or 2 are applicable to this embodiment.

Figure 5:
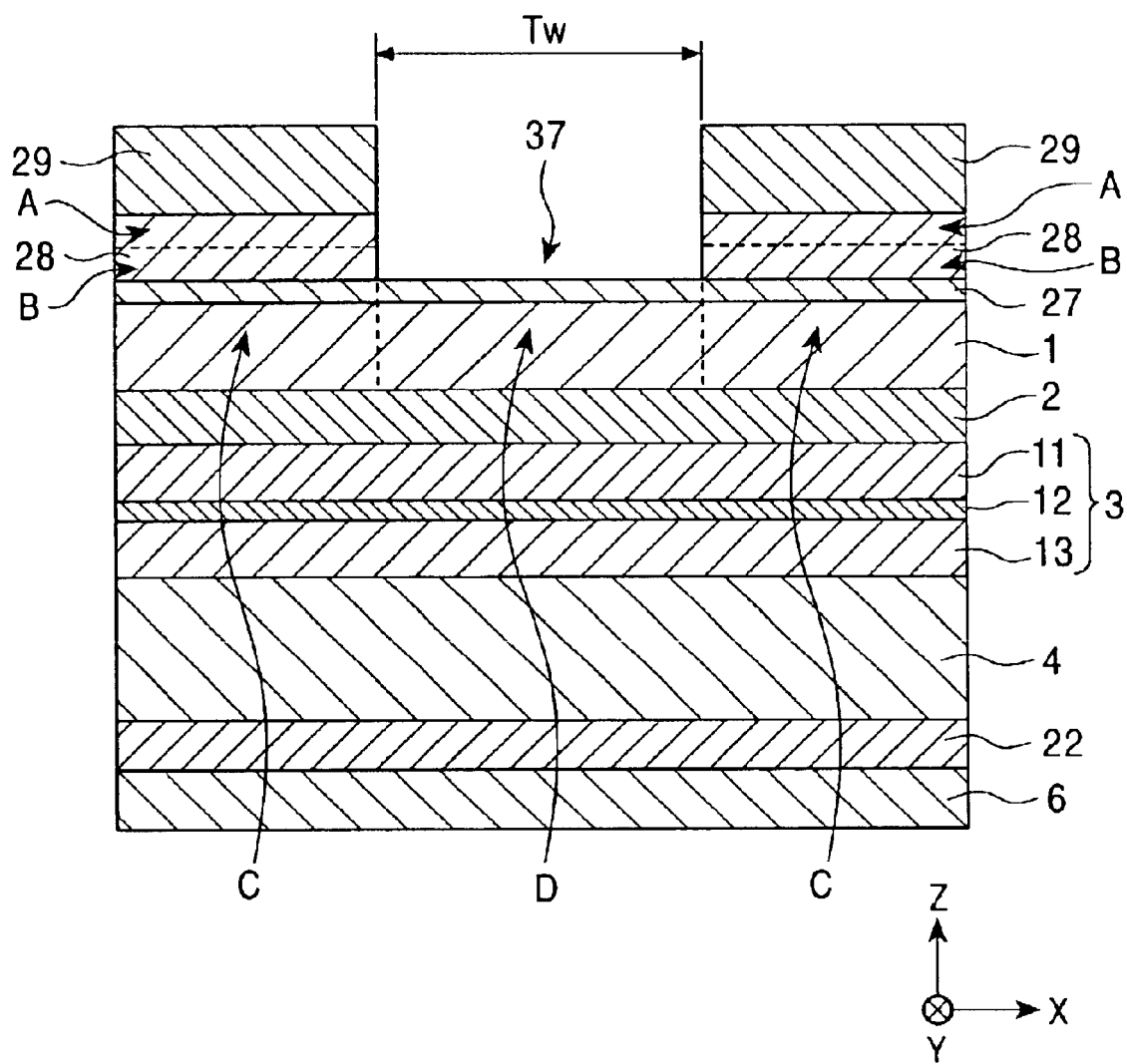
FIG. 5 is a sectional view showing the structure of a magnetic sensing element (single spin-valve magnetoresistive element) in a fifth embodiment of the present invention, viewed from the surface facing a recording medium.

FIG. 5 is a sectional view showing the structure of a magnetic sensing element (single spin-valve magnetoresistive element) in a fifth embodiment of the present invention, viewed from the surface facing a recording medium. The same layers as those in FIG. 1 are represented by the same reference numerals.

In this embodiment, a nonmagnetic interlayer 27 is formed on the free magnetic layer 1, and ferromagnetic layers 28 are formed on the nonmagnetic interlayer 27 with a predetermined distance (track width Tw) therebetween in the track width direction (in the X direction). Antiferromagnetic layers (exchange bias layers) 29 are formed further on the ferromagnetic layers 28.

In the embodiment shown in FIG. 5, the magnetization of the free magnetic layer 1 is directed in the X direction by the coupling magnetic field due to the RKKY interaction generated between the free magnetic layer 1 and the ferromagnetic layers 28.

In this embodiment, the magnetization of the ferromagnetic layers 28 is strongly pinned by the exchange coupling magnetic field (Hex) generated between the antiferromagnetic layers 29 and the ferromagnetic layers 28, and the magnetization of the side regions C of the free magnetic layer 1 is also pinned antiparallel to the magnetization direction of the ferromagnetic layers 28 by the coupling magnetic field due to the RKKY interaction.

Although the magnetization of the central region D of the free magnetic layer 1 is aligned in the X direction because the magnetization direction of the side regions C is directed in the X direction, the central region D is magnetized to such an extent that the magnetization of the central region D can be reversed in response to an external magnetic field. Thus, the central region D substantially contributes to the magnetoresistance effect.

The ferromagnetic layer 28 shown in FIG. 5 has the same function as that of the first magnetic sublayer 13 of the pinned magnetic layer 3 having the laminated ferrimagnetic structure, (i.e., the ferromagnetic layers 28 are provided in order to appropriately pin the side regions C of the free magnetic layer 1, and the ferromagnetic layers 28 do not substantially contribute to the magnetoresistance effect), and the ferromagnetic layer 28 has the same layer structure as that of the first magnetic sublayer 13.

That is, the ferromagnetic layer 28 includes a region A composed of a magnetic material containing X, wherein X is at least one element selected from the group consisting of Cr, Ti, V, Zr, Nb, Mo, Hf, Ta, and W, provided on the antiferromagnetic layer 29 side, and a region B composed of a magnetic material not containing X provided on the nonmagnetic interlayer 27 side.

Preferably, the region A is composed of a CoFeX alloy and the region B is composed of a CoFe alloy.

If the ferromagnetic layer 28 has the film structure described above, the exchange coupling magnetic field (Hex) generated between the antiferromagnetic layer 29 and the ferromagnetic layer 28 can be increased, and the coupling magnetic field due to the RKKY interaction generated between the free magnetic layer 1 and the ferromagnetic layer 28 can be increased. As a result, the unidirectional exchange bias magnetic field (Hex*) can be increased in the side regions C of the free magnetic layer 1.

Consequently, the magnetization of the side regions C of the free magnetic layer 1 can be pinned appropriately, and current-carrying reliability, such as ESD resistance and electromigration resistance, can be improved.

Although electrode layers are not shown in FIG. 5, the electrode layers may be formed at any position as long as a sensing current flows mainly through the nonmagnetic material layer 2, and for example, the electrode layers are formed at both sides in the X direction of the laminate shown in FIG. 5.

As described above, in accordance with this embodiment of the present invention, the unidirectional exchange bias magnetic field (Hex*) can be increased in the side regions C of the free magnetic layer 1, and current-carrying reliability can be improved. Therefore, it is possible to manufacture a magnetic sensing element which is suitable for higher recording densities.

With respect to the materials other than the magnetic materials containing CoFe alloys as major ingredients used for the regions A and B of the ferromagnetic layer 28, the compositional ratios, the thickness, etc., the same descriptions as those for the magnetic sensing element shown in FIG. 1 or 2 are applicable to this embodiment.

In the embodiment shown in FIG. 5, although the hard bias layers 5 shown in FIGS. 1 to 4 are not included, the hard bias layers 5 may be formed at both sides in the X direction of the laminate shown in FIG. 5, and electrode layers 8 may be formed on the hard bias layers 5.

In this embodiment, although the surface of the nonmagnetic interlayer 27 is exposed at a recess 37 formed between the ferromagnetic layers 28, parts of the ferromagnetic layers 28 may remain in the recess 37 and the surface of the ferromagnetic layer 28 may be exposed at the recess 37. Alternatively, the nonmagnetic interlayer 27 exposed at the recess 37 may be removed and the surface of the free magnetic layer 1 may be exposed at the recess 37.

Alternatively, the entirety of the ferromagnetic layer 28 and parts of the antiferromagnetic layers 29 may remain in the recess 37. If parts or the entirety of the ferromagnetic layers 28 remain, the free magnetic layer 1 functions as a laminated ferri-free (synthetic ferri-free) layer, and the same advantage as that in the case where the magnetic thickness of the free magnetic layer 1 is decreased can be exhibited, resulting in an improvement in read sensitivity.

Additionally, in the structure in which the region A of the ferromagnetic layer 28 remains in the recess 37, it is possible to reduce the amount of shunting of the sensing current into the ferromagnetic layer, and thus, the so-called "shunt loss" can be reduced, resulting in an improvement in the rate of change in resistance ($\Delta R/R$).

In order to form the recess 37 shown in FIG. 5, for example, in one method, after the nonmagnetic interlayer 27 is deposited on the free magnetic layer 1, a resist layer for a lift-off process is formed in the center of the nonmagnetic interlayer 27, the ferromagnetic layers 28 and the antiferromagnetic layers 29 are deposited in the side regions in the track width direction (in the X direction) of the nonmagnetic interlayer 27 not covered with the resist layer, and then the resist layer is removed. Alternatively, in another method, after the ferromagnetic layer 28 and the antiferromagnetic layer 29 are deposited evenly on the nonmagnetic interlayer 27, the side regions in the track width direction of the antiferromagnetic layer 29 are protected with resist layers, and the central regions of the antiferromagnetic layer 29 and the ferromagnetic layer 28 are trimmed by etching or the like, to form the recess 37.

Figure 6:
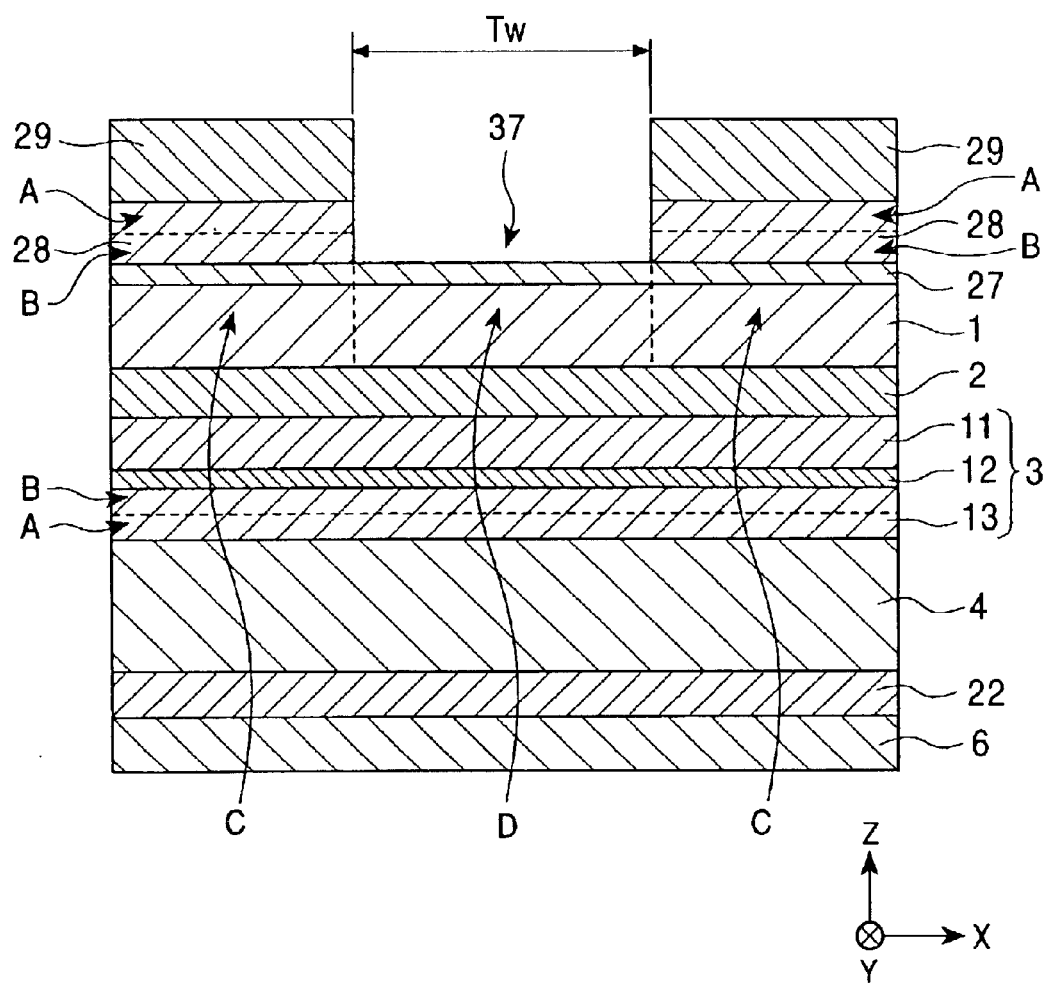
FIG. 6 is a sectional view showing the structure of a modified magnetic sensing element (single spin-valve magnetoresistive element) in the fifth embodiment of the present invention, viewed from the surface facing a recording medium.

FIG. 6 is a modified example of the magnetic sensing element shown in FIG. 5. The magnetic sensing element shown in FIG. 6 differs from the magnetic sensing element shown in FIG. 5 with respect to the layer structure of the first magnetic sublayer 13 of the pinned magnetic layer 3.

In the magnetic sensing element shown in FIG. 5, the first magnetic sublayer 13 constituting the pinned magnetic layer 3 has a single-layer structure not containing X, for example, composed of a CoFe alloy, similar to the conventional case. On the other hand, in the first magnetic sublayer 13 of the magnetic sensing element shown in FIG. 6, similar to the embodiment shown in FIG. 1, a magnetic region A containing X, wherein X is at least one element selected from the group consisting of Cr, Ti, V, Zr, Nb, Mo, Hf, Ta, and W, extends from the interface with the antiferromagnetic layer 4 toward the nonmagnetic intermediate sublayer 12, and a magnetic region B not containing X extends from the interface with the nonmagnetic intermediate sublayer 12 toward the antiferromagnetic layer 4. Additionally, the first magnetic sublayer 13 may be formed so as to have a laminated structure including at least two magnetic zones as shown in FIG. 2.

Consequently, in the embodiment shown in FIG. 6, an improvement in current-carrying reliability and an improvement in the rate of change in resistance can be achieved simultaneously and more effectively, and it is possible to manufacture a magnetic sensing element which is suitable for higher recording densities.

Additionally, the ferromagnetic layer 28 may be a single layer not containing X, for example, composed of a CoFe alloy, and the first magnetic sublayer 13 constituting the pinned magnetic layer 3 may be formed so as to include the magnetic region A containing X.

The magnetic moment difference (Net Mst) between the first magnetic sublayer 13 and the second magnetic sublayer 11 with reference to FIGS. 1 to 6 will now be described.

Herein, the magnetic moment difference corresponds to the value obtained by subtracting the magnetic moment per unit area of the first magnetic sublayer 13 from the magnetic moment per unit area of the second magnetic sublayer 11.

In the present invention, the magnetic moment difference is preferably in the range of −0.63 to 0.63 T·nm, wherein a magnetic moment difference of 0 T·nm is excluded therefrom. It is known that if the magnetic moment difference falls below −0.63, the read output starts to decrease rapidly. The reason for this is that, if the magnetic moment difference negatively increases, that is, if the magnetic moment per unit area of the first magnetic sublayer 13 further becomes larger than the magnetic moment per unit area of the second magnetic sublayer 11, the amount of shunting of the sensing current into the first magnetic sublayer 13 increases.

However, in the present invention, as described above, even if the magnetic moment difference is negative, if the magnetic moment difference is greater than or equal to −0.63 T·nm and less than 0 T·nm, the read output rather shows a tendency of slightly increasing compared to the case where the magnetic moment difference is positive. In contrast, when the first magnetic sublayer 13 is composed of a magnetic material not containing X, such as a CoFe alloy, if the magnetic moment difference is decreased from 0 T·nm, the read output shows a tendency of decreasing monatomically.

That is, by providing the magnetic region containing X in the first magnetic sublayer 13 as in the case of the present invention, if the magnetic moment difference is set to be greater than or equal to −0.63 T·nm and less than 0 T·nm, it is possible to improve the read output more appropriately.

If the magnetic moment exceeds 0.63 T·nm, the inclination angle of the magnetization of the second magnetic sublayer 11 in particular is increased, resulting in an increase in asymmetry and a decrease in the read output.

Herein, the inclination angle of the magnetization of the second magnetic sublayer 11 corresponds to an inclination with respect to the height direction which is set as 0 degrees. In the process of manufacturing the magnetic sensing element having the exchange bias system, in order to measure the inclination angle of the magnetization of the second magnetic sublayer 11, a magnetic sensing element (flat film unit), which has been annealed in the first magnetic field in the height direction and then annealed in the second magnetic field in the track width direction (in the X direction) perpendicular to the height direction, is used, and the R-H curve is obtained by applying a magnetic field in a direction perpendicular to the original magnetization direction of the pinned magnetic layer.

In the present invention, by setting the magnetic moment difference (Net Mst) be in the range of −0.63 to 0.63 T·nm, wherein a magnetic moment difference of 0 T·nm is excluded therefrom, the read output can be more effectively improved compared to the conventional case, and the inclination angle of the magnetization of the second magnetic sublayer 11 can be brought closer to zero.

In the present invention, preferably, the magnetic moment difference is negative. That is, preferably, the magnetic moment difference is greater than or equal to −0.63 T·nm and less than 0 T·nm. When the magnetic moment difference is negative, while the read output shows a tendency of decreasing in the conventional case, the read output shows a tendency of slightly increasing in the present invention. Thus, it is possible to improve the read output effectively compared to the conventional case. Moreover, the inclination angle of the magnetization of the second magnetic sublayer 11 can be brought closer to 0 degrees, asymmetry can be decreased, and read output can be increased compared with the case where the magnetic moment difference is positive.

Furthermore, in the present invention, the thickness of the first magnetic sublayer 13 is larger than the thickness of the second magnetic sublayer 11. As described above, in the present invention, the magnetic moment difference can be set to be greater than or equal to −0.63 T·nm and less than 0 T·nm. When the magnetic moment difference is greater than or equal to −0.63 T·nm and less than 0 T·nm, the magnetic moment per unit area of the first magnetic sublayer 13 is larger than the magnetic moment per unit area of the second magnetic sublayer 11.

Herein, the magnetic moment per unit area corresponds to the product of the saturation magnetization (Ms) and the thickness (t). Consequently, by increasing the thickness (t), the magnetic moment per unit area can be increased.

Therefore, in the present invention, in order to set the magnetic moment difference to be greater than or equal to −0.63 T·nm and less than 0 T·nm, the thickness of the first magnetic sublayer 13 is preferably larger than the thickness of the second magnetic sublayer 11.

By setting the thickness of the first magnetic sublayer 13 to be larger than the thickness of the second magnetic sublayer 11, the unidirectional exchange bias magnetic field (Hex*) can be increased, and thus the inclination angle of the magnetization of the second magnetic sublayer 11 can be decresed.

In the present invention, since the first magnetic sublayer 13 includes the magnetic region A containing X having a high resistivity, even if the thickness of the first magnetic sublayer 13 is increased, it is possible to reduce the decrease in the rate of change in resistance (ΔR/R) or the change in resistance (ΔRs) compared to the conventional case.

Since the magnetic region A containing X having a high resistivity lies in the first magnetic sublayer 13 in contact with the antiferromagnetic layer 4, the exchange coupling magnetic field (Hex) generated between the antiferromagnetic layer 4 and the first magnetic sublayer 13 is increased, and the inclination angle of the magnetization of the pinned magnetic layer 3 due to the decrease in the exchange coupling magnetic field can be minimized.

Additionally, the advantage in that the inclination angle of magnetization can be decreased can be exhibited in the magnetic sensing element shown in any one of FIGS. 1 to 6. In the hard bias system shown in any one of FIGS. 1 to 4, it is possible to appropriately solve the problem in that the magnetization of both sides in the track width direction of the pinned magnetic layer 3 is inclined under the influence of the longitudinal bias magnetic field from the hard bias layers 5.

With respect to the pinned magnetic layer in the exchange bias system, the inclination angle of magnetization is measured after the process in which annealing treatment in the first magnetic field in the height direction (in the Y direction) is performed, and then annealing treatment in the second magnetic field is performed in the track width direction (in the X direction). Such a pattern of annealing treatment in the magnetic fields is used in the process of manufacturing the exchange bias system as shown in FIG. 6.

Therefore, in the exchange bias system shown in FIG. 6, it is possible to reduce the inclination of the pinned magnetization direction of the pinned magnetic layer 3 and the increase in dispersion angle. Therefore, read output can be more effectively increased and asymmetry can be improved compared to the conventional case.

In the magnetic sensing element shown in any one of FIGS. 1 to 6, the direction of the sensing current magnetic field generated from the sensing current is preferably made to agree with the direction of the resultant magnetic field of the first magnetic sublayer 13 and the second magnetic sublayer 11 constituting the pinned magnetic layer 3.

For example, referring to FIG. 1, when the magnetic moment per unit area of the first magnetic sublayer 13 of the pinned magnetic layer 3 is greater than the magnetic moment per unit area of the second magnetic sublayer 11, the magnetization of the first magnetic sublayer 13 is directed in a direction opposite to the Y direction, and the magnetization of the second magnetic sublayer is directed in the Y direction, the resultant magnetization of the pinned magnetic layer 3 is directed in the direction opposite to the Y direction.

In order to make the direction of the resultant magnetization of the pinned magnetic layer 3 and the direction of the sensing current magnetic field agree with each other, a sensing current is applied from the right-hand side electrode layer 8 to the left-hand side electrode layer 8. The sensing current primarily flows through the nonmagnetic material layer 2, and the sensing current magnetic field generated according to the corkscrew rule is directed in the direction opposite to the Y direction on the pinned magnetic layer 3 side. In this way, when the direction of the resultant magnetization of the pinned magnetic layer 3 and the direction of the sensing current magnetic field are made to agree with each other, the magnetization of the pinned magnetic layer 3 can be pinned more strongly, and thus it is possible to manufacture a magnetic sensing element having excellent read characteristics and reliability in which asymmetry, read output, current-carrying reliability, etc. are improved.

Figure 7:
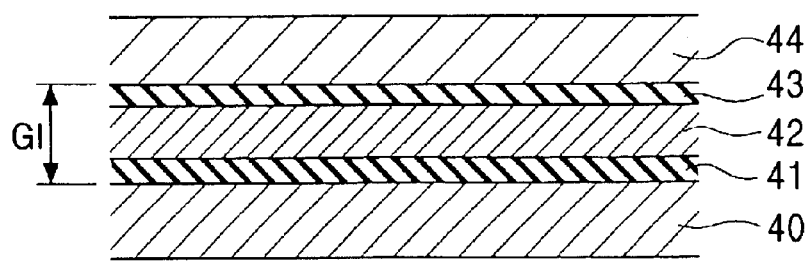
FIG. 7 is a partial sectional view of a thin-film magnetic head including a magnetic sensing element.

FIG. 7 is a sectional view showing the structure of a read head including the magnetic sensing element shown in any one of FIGS. 1 to 6, viewed from the surface facing a magnetic recording medium.

As shown in FIG. 7, a lower gap layer 41 is formed on a lower shielding layer 40 composed of a NiFe alloy or the like. A magnetic sensing element 42 shown in any one of FIGS. 1 to 6 is formed on the lower gap layer 41, and an upper gap layer 43 is formed on the magnetic sensing element 42. An upper shielding layer 44 composed of a NiFe alloy or the like is formed on the upper gap layer 43.

The lower gap layer 41 and the upper gap layer 43 are composed of an insulating material, such as $SiO_2$ or $Al_2O_3$. As shown in FIG. 7, the length from the lower gap layer 41 to the upper gap layer 43 corresponds to a gap length Gl, and as the gap length Gl is decreased, the read head becomes more suitable for higher recording densities.

In accordance with the present invention, even if the thickness of the antiferromagnetic layer 4 is decreased, a large exchange coupling magnetic field (Hex) can be generated. The antiferromagnetic layer 4 is formed, for example, with a thickness of 70 Å or more, and thus, the thickness of the antiferromagnetic layer 4 can be sufficiently decreased compared to the conventional case where the thickness of the antiferromagnetic layer is approximately 300 Å. The large exchange coupling magnetic field (Hex) can be obtained because the region A composed of a magnetic material containing X, and preferably, a CoFeX alloy, having a high resistivity is formed on the antiferromagnetic layer 4 side of the first magnetic sublayer 13 in this invention. Therefore, even if the thickness of the antiferromagnetic layer 4 is decreased, a sufficiently large exchange coupling magnetic field (Hex) can be obtained.

Consequently, by narrowing the gap, it is possible to manufacture a thin-film magnetic head which is suitable for higher recording densities.

Additionally, an inductive head for writing may be formed on the upper shielding layer 44.

The magnetic sensing elements of the present invention may be used for magnetic sensors, etc., in addition for magnetic heads built in hard disk drives.

Figure 8:
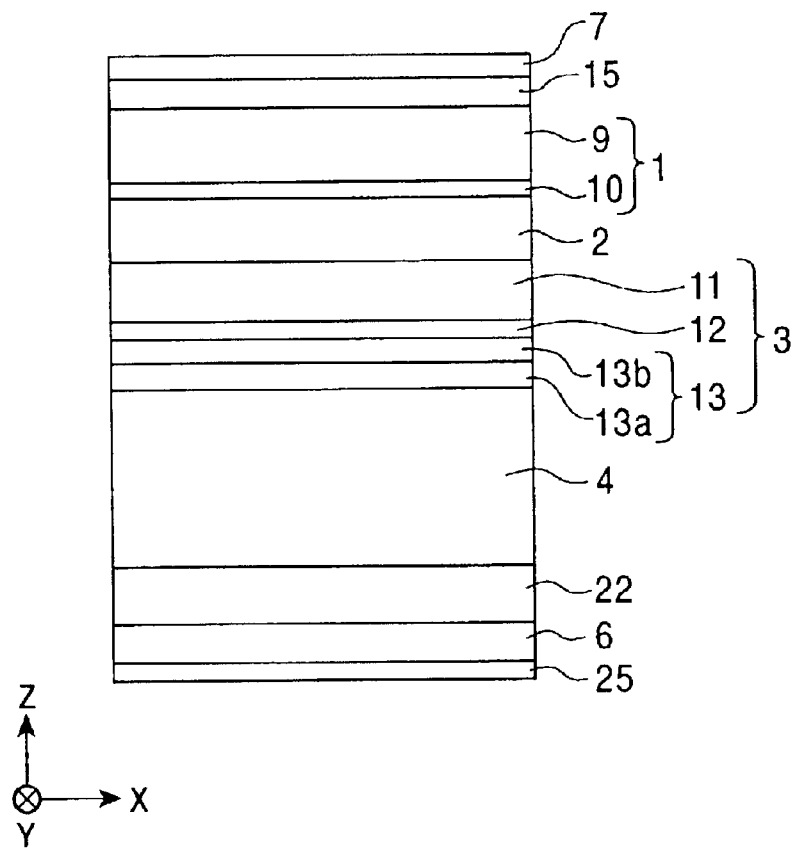
FIG. 8 is a schematic diagram illustrating a method for manufacturing a magnetic sensing element in the present invention.

A method for manufacturing a magnetic sensing element in the present invention will now be described below. FIG. 8 is a schematic diagram showing a part of the magnetic sensing element.

First, an underlayer 6 is formed on a substrate 25. The underlayer 6 is preferably composed of at least one element selected from the group consisting of Ta, Hf, Nb, Zr, Ti, Mo, and W. A seed layer 22 is formed by sputtering on the underlayer 6, using a target composed of NiFeCr or Cr, for example, with a thickness of approximately 20 to 60 Å. When the seed layer 22 is composed of NiFeCr, for example, the compositional ratio thereof is $(Ni_{0.8}Fe_{0.2})_{60at\%}Cr_{40at\%}$.

Next, an antiferromagnetic layer 4 is formed by sputtering on the seed layer 22.

In the present invention, the antiferromagnetic layer 4 is formed by sputtering, preferably, using an antiferromagnetic material containing X and Mn, wherein X is at least one element selected from the group consisting of Pt, Pd, Ir, Rh, Ru, and Os.

The antiferromagnetic layer 4 may be formed using an X—Mn—X' alloy, wherein X' is at least one element selected from the group consisting of Ne, Ar, Kr, Xe, Be, B, C, N, Mg, Al, Si, P, Ti, V, Cr, Fe, Co, Ni, Cu, Zn, Ga, Ge, Zr, Nb, Mo, Ag, Cd, Ir, Sn, Hf, Ta, W, Re, Au, Pb, and rare-earth elements.

In the present invention, preferably, the X content or the X+X' content is in the range of 45 to 60 atomic percent.

A pinned magnetic layer 3 is formed by sputtering on the antiferromagnetic layer 4.

As shown in FIG. 8, the pinned magnetic layer 3 has a laminated ferrimagnetic structure including a first magnetic sublayer 13, a nonmagnetic intermediate sublayer 12 formed on the first magnetic sublayer 13, and a second magnetic sublayer 11 formed on the nonmagnetic intermediate sublayer 12.

In the present invention, the first magnetic sublayer 13 is formed by the following method. That is, a magnetic zone 13a composed of a magnetic material containing X, wherein X is at least one element selected from the group consisting of Cr, Ti, V, Zr, Nb, Mo, Hf, Ta, and W, for example, preferably, a CoFeX alloy, and more preferably, a CoFeCr alloy, is formed by sputtering on the antiferromagnetic layer 4. Preferably, the X content is in the range of 3 to 15 atomic percent.

Next, a magnetic zone 13b composed of a magnetic material not containing X, for example, preferably, a CoFe alloy, is formed by sputtering on the magnetic zone 13a.

As described above, the first magnetic sublayer 13 has a two-layered structure including the magnetic zone 13a and the magnetic zone 13b. Since the magnetic zone 13a contains X, the resistivity of the magnetic zone 13a is higher than that of the magnetic zone 13b.

The nonmagnetic intermediate sublayer 12 is formed by sputtering on the first magnetic sublayer 13. Preferably, the nonmagnetic intermediate sublayer 12 is composed of at least one element selected from the group consisting of Ru, Rh, Ir, Os, Cr, Re, and Cu.

Next, the second magnetic sublayer 11 is formed by sputtering on the nonmagnetic intermediate sublayer 12. In the present invention, although the second magnetic sublayer 11 may be composed of any magnetic material, in order to appropriately increase the coupling magnetic field due to the RKKY interaction generated between the second magnetic sublayer 11 and the first magnetic sublayer 13, a CoFe alloy is preferably used.

Next, a nonmagnetic material layer 2 composed of Cu or the like, a free magnetic layer 1, for example, having a two-layered structure including a CoFe alloy sublayer 10 and a NiFe alloy sublayer 9, a back layer 15 composed of Cu or the like, and a protective layer 7 (for example, a specular reflection layer composed of an oxide of Ta or the like) are formed in that order by sputtering on the second magnetic sublayer 11.

Annealing treatment is then performed. The antiferromagnetic layer 4 is preferably composed of the X—Mn alloy or the X—Mn—X' alloy described above. When such antiferromagnetic materials are used, annealing treatment must be performed to generate an exchange coupling magnetic field (Hex) at the interface with the pinned magnetic layer 3. Therefore, in the present invention, an exchange coupling magnetic field (Hex) can be generated at the interface between the antiferromagnetic layer 4 and the first magnetic sublayer 13 of the pinned magnetic layer 3 by performing annealing treatment. At this stage, by applying a magnetic field parallel to the Y direction, the magnetization of the pinned magnetic layer 3 can be pinned parallel to the Y direction. Since the pinned magnetic layer 3 has the laminated ferrimagnetic structure, the magnetization directions of the first magnetic sublayer 13 and the second magnetic sublayer 11 are antiparallel to each other.

By performing the annealing treatment, a large exchange coupling magnetic field (Hex) can be generated between the magnetic zone 13a containing X, for example, composed of a CoFeX alloy, and the antiferromagnetic layer 4.

On the other hand, the magnetic zone 13b not containing X, for example, composed of a CoFe alloy, is provided on the nonmagnetic intermediate sublayer 12 side of the first magnetic sublayer 13, and it is possible to generate a large coupling magnetic field due to the RKKY interaction between the magnetic zone 13b and the second magnetic sublayer 11.

Consequently, in the present invention, the unidirectional exchange bias magnetic field (Hex*) in the pinned magnetic layer 3 can be appropriately increased compared with the conventional case.

By performing the annealing treatment, thermal diffusion occurs between the magnetic zones 13a and 13b constituting the first magnetic sublayer 13, and the constituent elements are mixed at the interface between the magnetic zone 13a and the magnetic zone 13b.

Therefore, after annealing treatment, it is difficult to clearly observe the borderline between the magnetic zone 13a and the magnetic zone 13b, and the first magnetic sublayer 13 appears to be a single layer. When the compositional ratio of the first magnetic sublayer 13 is measured after annealing treatment, a composition gradient is observed in the first magnetic sublayer 13.

In a region in the vicinity of the interface between the magnetic zone 13a and the magnetic zone 13b, the X content is gradually decreased from the antiferromagnetic layer 3 side toward the nonmagnetic intermediate sublayer 12 side, and thus the composition gradient is observed.

However, when the antiferromagnetic layer 4 is composed of a material which is capable of generating an exchange coupling magnetic field (Hex) at the interface with the first magnetic sublayer 13 without annealing, or when the annealing conditions do not allow thermal diffusion to occur between the magnetic zone 13a and the magnetic zone 13b, the composition gradient may not be produced. In such a case, the interface between the magnetic zone 13a and the magnetic zone 13b is clearly observed, or even if the interface is not observed, a significant change in the X content, for example, a sudden decrease of the X content close to 0 atomic percent, is observed in the vicinity of the interface from the antiferromagnetic layer 4 side to the nonmagnetic intermediate sublayer 12 side.

In the manufacturing method described with reference to FIG. 8, although the first magnetic sublayer 13 has a two-layered structure including the magnetic zone 13a and the magnetic zone 13b, the first magnetic sublayer may have a layered structure including more than two zones. Even in such a case, a magnetic zone containing X having a high resistivity is provided on the side in contact with the antiferromagnetic layer 4 and a magnetic zone not containing X having a low resistivity is provided on the side in contact with the nonmagnetic intermediate sublayer 12.

Alternatively, in another manufacturing method, when the first magnetic sublayer 13 is formed, for example a target composed of CoFe and a target composed of X (preferably, Cr) are prepared. At the initial stage during the formation of the first magnetic sublayer 13 on the interface with the antiferromagnetic layer 4, electric power is applied to both the target composed of CoFe and the target composed of X to form a magnetic zone composed of CoFeCr, and then electric power applied to the target composed of X is gradually decreased, and thus the X content in the CoFeX layer to be formed is decreased. At the final stage, electric power applied to the target composed of X is set at 0 W so that a magnetic zone not containing X composed of a CoFe alloy can be formed.

By such a method, since the CoFeCr alloy containing X having a high resistivity is present at the interface with the antiferromagnetic layer 4, it is possible to generate a large exchange coupling magnetic field (Hex) between the first magnetic sublayer 13 and the antiferromagnetic layer 4. Since the CoFe alloy not containing X having a low resistivity is present at the interface with the nonmagnetic intermediate sublayer 12, a large coupling magnetic field due to the RKKY interaction can be generated between the first magnetic sublayer 13 and the second magnetic sublayer 11. Therefore, the unidirectional exchange bias magnetic field (Hex*) in the pinned magnetic layer 3 can be appropriately increased compared with the conventional case.

In accordance with the method for manufacturing the magnetic sensing element of the present invention, since the magnetic zone 13a having a high resistivity lies in the first magnetic sublayer 13, it is possible to decrease the amount of shunting of the sensing current flowing from the electrode layer into the first magnetic sublayer 13, and thus, the so-called "shunt loss" can be decreased, and a high rate of change in resistance ($\Delta R/R$) can be obtained.

The method for manufacturing the magnetic sensing element described above may be used for any one of the magnetic sensing elements shown in FIGS. 2 to 4.

However, in the case of the magnetic sensing element having the exchange bias system as shown in FIG. 5 or 6, an exchange coupling magnetic field must be generated between the ferromagnetic layer 28 and the antiferromagnetic layer (exchange bias layer) 29 in addition to the generation of the exchange coupling magnetic field between the antiferromagnetic layer 4 and the pinned magnetic layer 3.

Therefore, for example, after the layers up to the nonmagnetic interlayer 27 are formed, first annealing treatment is performed in a magnetic field in the height direction (in the Y direction). For example, in a magnetic field of 10 kOe (approximately 800 kA/m), the annealing treatment is performed at 290° C. for 4 hours. Thereby, an exchange coupling magnetic field is generated between the antiferromagnetic layer 4 and the pinned magnetic layer 3 to pin the magnetization direction of the pinned magnetic layer 3 parallel to the height direction.

Next, the ferromagnetic layer 28 and the antiferromagnetic layer 29 are formed, and annealing treatment is performed in a second magnetic field in the track width direction (in the X direction). For example, in a magnetic field of 300 Oe (approximately 24 kA/m), the annealing treatment is performed at 290° C. for 4 hours. Thereby, an exchange coupling magnetic field is generated between the ferromagnetic layer 28 and the antiferromagnetic layer 29.

At this stage, the magnetization of the pinned magnetic layer 3 which has been pinned in the height direction may be fluctuated under the influence of the annealing treatment in the second magnetic field. However, in the present invention, since the magnetic moment difference (Net Mst) between the first magnetic sublayer 13 and the second magnetic sublayer 11 and the thicknesses are optimized as described above, it is possible to minimize the inclination (inclination angle of magnetization) of the second magnetic sublayer 11 with respect to the height direction (the Y direction) can be minimized. Therefore, in the present invention, it is possible to appropriately and easily manufacture magnetic sensing elements having the exchange bias system with a small asymmetry and a large read output.

EXAMPLES

Four laminated films having the following layer structure with single-layer pinned magnetic layers composed of different materials were prepared. With respect to each laminated film, the magnitude of the exchange coupling magnetic field (Hex) generated between the pinned magnetic layer and the antiferromagnetic layer was measured.

The layer structure and thicknesses (thickness value indicated in parentheses) were, in order from the bottom: seed layer: $(Ni_{0.8}Fe_{0.2})_{60at\%}Cr_{40at\%}$(55 Å); antiferromagnetic layer: $Pt_{50at\%}Mn_{50at\%}$(160 Å); pinned magnetic layer: material as shown in Table 1 (20 Å); nonmagnetic material layer: Cu(40 Å); free magnetic layer: $[Co_{90at\%}Fe_{10at\%}$(10 Å) and $Ni_{80at\%}Fe_{20at\%}$(50 Å)]; and protective layer: Ta(30 Å).

After magnetic sensing elements having the layer structure described above were formed, annealing was performed to generate an exchange coupling magnetic field (Hex) between the antiferromagnetic layer and the pinned magnetic layer, and the magnitude thereof was measured. The experimental results are shown in Table 1 below.

TABLE 1

| Material for pinned magnetic layer | Saturation magnetization Ms of pinned magnetic layer (T) | Saturation magnetization Ms ratio of pinned magnetic layer to CoFe | Exchange coupling magnetic field Hex (A/m) | Exchange coupling energy J per unit area (mJ/m²) |
|---|---|---|---|---|
| $(Co_{0.9}Fe_{0.1})_{95}Cr_5$ | 1.36 | 0.80 | $7.7 \times 10^4$ | 0.21088 |
| $Co_{90}Fe_{10}$ | 1.70 | 1.00 | $4.9 \times 10^4$ | 0.16727 |
| $Co_{50}Fe_{50}$ | 2.39 | 1.41 | $3.2 \times 10^4$ | 0.15575 |
| $Ni_{80}Fe_{20}$ | 1.09 | 0.64 | $3.7 \times 10^4$ | 0.08078 |

As shown in Table 1, the $(Co_{0.9}Fe_{0.1})_{95at\%}Cr_{5at\%}$ alloy, the $Co_{90at\%}Fe_{10at\%}$ alloy, the $Co_{50at\%}Fe_{50at\%}$ alloy, and the $Ni_{80at\%}Fe_{20at\%}$ alloy were used for the corresponding pinned magnetic layers.

When the CoFeCr alloy was used for the pinned magnetic layer, the exchange coupling magnetic field (Hex) was larger compared with the case in which the CoFe alloy was used, and was approximately twice as large as the exchange coupling magnetic field obtained when the NiFe alloy was used for the pinned magnetic layer.

With respect to the exchange coupling energy J per unit area shown in the rightmost column of Table 1, the CoFeCr alloy had the highest exchange coupling energy J.

As is obvious from the experiment, in order to generate a large exchange coupling magnetic field (Hex) between the pinned magnetic layer and the antiferromagnetic layer, preferably, the CoFeCr alloy is used for the pinned magnetic layer rather than the CoFe alloy.

Next, laminated films having the following layer structure were prepared. In each sample, the magnitude of the unidirectional exchange bias magnetic field (Hex*) of the pinned magnetic layer was measured, the pinned magnetic layer having a laminated ferrimagnetic structure including a first magnetic sublayer, a nonmagnetic intermediate sublayer, and a second magnetic sublayer.

Herein, the unidirectional exchange bias magnetic field (Hex*) is the combination of the exchange coupling magnetic field (Hex) generated between the pinned magnetic layer and the antiferromagnetic layer and the coupling magnetic field due to the RKKY interaction generated between the first magnetic sublayer and the second magnetic sublayer constituting the pinned magnetic layer.

The layer structure and thicknesses (thickness value indicated in parentheses) were, in order from the bottom: seed layer $(Ni_{0.8}Fe_{0.2})_{60at\%}Cr_{40at\%}$(55 Å); antiferromagnetic layer: $Pt_{50at\%}Mn_{50at\%}$(160 Å); pinned magnetic layer: [first magnetic sublayer: material as shown in Table 2 (18 Å); nonmagnetic intermediate sublayer: Ru(8.7 Å); and second magnetic sublayer: material as shown in Table 2 (22 Å)]; nonmagnetic material layer: Cu(21 Å); free magnetic layer: [$Co_{90at\%}Fe_{10at\%}$(10 Å); $Ni_{80at\%}Fe_{20at\%}$(18 Å)]; nonmagnetic material layer: Cu(10 Å); and protective layer: Ta(30 Å).

After magnetic sensing elements having the layer structure described above were formed, annealing was performed, and the unidirectional exchange bias magnetic field (Hex*) of the pinned magnetic layer was measured. The experimental results are shown in Table 2 below.

TABLE 2

| Material for first magnetic sublayer | Material for second magnetic sublayer | Resultant magnetic moment per unit area of first magnetic sublayer and second magnetic sublayer in laminated ferrimagnetic pinned layer $10^{-5}$ (T · nm) | Saturation magnetic field Hs (A/m) | Unidirectional exchange bias magnetic field Hex* (A/m) |
|---|---|---|---|---|
| $Co_{90}Fe_{10}$ | $Co_{90}Fe_{10}$ | 0.679 | $6.7 \times 10^5$ | $1.82 \times 10^5$ |
| $(Co_{0.9}Fe_{0.1})_{95}Cr_5$ | $Co_{90}Fe_{10}$ | 1.23 | $5.2 \times 10^5$ | $1.23 \times 10^5$ |
| $(Co_{0.9}Fe_{0.1})_{95}Cr_5$ | $(Co_{0.9}Fe_{0.1})_{95}Cr_5$ | 0.555 | $5.5 \times 10^5$ | $1.3 \times 10^5$ |
| $Co_{90}Fe_{10}$ | $(Co_{0.9}Fe_{0.1})_{95}Cr_5$ | 0.001 | $6.3 \times 10^5$ | $1.80 \times 10^5$ |

As is clear from Table 2, in the sample in which the CoFe alloy was selected for both the first magnetic sublayer and the second magnetic sublayer, the largest unidirectional exchange bias magnetic field (Hex*) was generated.

The saturation magnetic field (Hs) of this sample was also significantly large compared to the other samples. Herein, the saturation magnetic field (Hs) is the magnitude of the magnetic field when the magnetizations of the first magnetic sublayer and the second magnetic sublayer sandwiching the nonmagnetic intermediate sublayer therebetween are directed in the same direction. The large saturation magnetic field (Hs) means that the coupling magnetic field due to the RKKY interaction generated between the first magnetic sublayer and the second magnetic sublayer is strong, and that the antiparallel state of the magnetizations of the first magnetic sublayer and the second magnetic sublayer is not easily lost.

That is, when the CoFe alloy is selected for both the first magnetic sublayer and the second magnetic sublayer, the antiparallel state of the magnetizations of the first magnetic sublayer and the second magnetic sublayer is most resistant to loss, and the coupling magnetic field due to the RKKY interaction is considered to be significantly high compared to the other samples.

Based on the above conclusion and the conclusion obtained from Table 1, in order to increase the exchange coupling magnetic field (Hex) generated at the interface with the antiferromagnetic layer, a magnetic region composed of a CoFeCr alloy is formed on the antiferromagnetic layer side of the first magnetic sublayer, and in order to increase the coupling magnetic field due to the RKKY interaction, a magnetic region composed of a CoFe alloy is formed on the nonmagnetic intermediate sublayer side of the first magnetic sublayer.

Consequently, a large exchange coupling magnetic field (Hex) can be obtained between the antiferromagnetic layer and the CoFeCr alloy region, and the coupling magnetic field due to the RKKY interaction generated between the CoFe alloy region formed on the nonmagnetic intermediate sublayer side of the first magnetic sublayer and the second magnetic sublayer can be increased. Therefore, it is possible to increase the unidirectional exchange bias magnetic field (Hex*) in the pinned magnetic layer compared with the case in which the first magnetic sublayer is formed of a single region composed of a CoFe alloy or CoFeCr alloy.

Next, a laminated film having the following layer structure was prepared, and the first magnetic sublayer thereof was formed so as to have a laminated structure including of a CoFeCr alloy region and a CoFe alloy region. The optimum thickness and thickness ratio of the CoFeCr alloy region were defined in view of various characteristics.

The layer structure and thicknesses (thickness value indicated in parentheses) were, in order from the bottom: Si substrate; alumina; seed layer: $(Ni_{0.8}Fe_{0.2})_{60at\%}Cr_{40at\%}$(60 Å); antiferromagnetic layer: $Pt_{50at\%}Mn_{50at\%}$(100 Å); pinned magnetic layer: [first magnetic sublayer: $(Co_{0.9}Fe_{0.1})_{95at\%}Cr_{5at\%}$(x Å) and $Co_{90at\%}Fe_{10at\%}$(14-X Å); nonmagnetic intermediate sublayer: Ru(8.7 Å); second magnetic sublayer: $Co_{90at\%}Fe_{10at\%}$(3 Å); and specular film (CoFe-Oxide) and $Co_{90at\%}Fe_{10at\%}$(18 Å)]; nonmagnetic material layer: Cu(21 Å); free magnetic layer: $Co_{90at\%}Fe_{10at\%}$(20 Å); back layer: Cu(4.5 Å); and specular film: Ta-Oxide.

After the above laminated film was formed, annealing was performed at 290° C. for 4 hours in a magnetic field of 800 kA/m. The interface between the CoFeCr alloy region and the CoFe alloy region constituting the first magnetic sublayer became obscure due to diffusion.

In the experiment, the thickness of the CoFeCr alloy region constituting the first magnetic sublayer was increased from 0 Å to 14 Å, and the thickness of the CoFe alloy region constituting the first magnetic sublayer was decreased from 14 Å to 0 Å. The thickness of the first magnetic sublayer was maintained at 14 Å.

Figure 9:
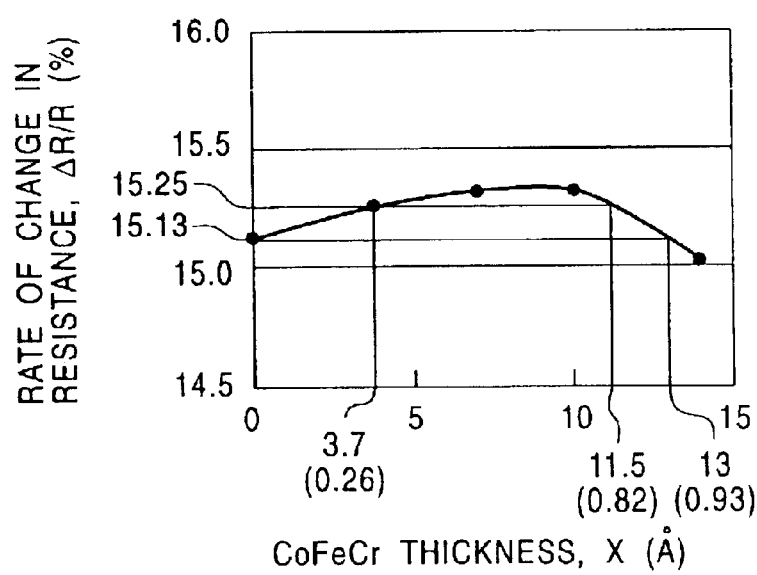
FIG. 9 is a graph showing the relationship between the thickness of a CoFeCr alloy region and the rate of change in resistance ($\Delta R/R$) with respect to a first magnetic sublayer having a two-layered structure including the CoFeCr alloy region and a CoFe alloy region.

The relationship between the rate of change in resistance ($\Delta R/R$) and the thickness X of the CoFeCr alloy region and the relationship between the rate of change in resistance ($\Delta R/R$) and the thickness ratio were investigated. The results thereof are shown in FIG. 9. Herein, the thickness ratio means the ratio of the thickness of the CoFeCr alloy region to the total thickness of the first magnetic sublayer and is shown on the abscissa of the graph in parentheses under the thickness value.

As shown in FIG. 9, as the thickness of the CoFeCr alloy region increased, the rate of change in resistance increased, and when the thickness of the CoFeCr alloy region exceeded 10 Å, the rate of change in resistance started to decrease.

Preferably, the thickness of the CoFeCr alloy region is selected so that the rate of change in resistance is at least larger than the rate of change in resistance (15.13%) obtained when the first magnetic sublayer is composed of a single CoFe alloy region (i.e., the thickness of the CoFeCr alloy is 0 Å).

Accordingly, in the present invention, the thickness of the CoFeCr alloy region is set to be greater than 0 Å and less than or equal to 13 Å (in terms of thickness ratio, greater than 0 and less than or equal to 0.93). Consequently, it is possible to obtain a rate of change in resistance of 15.13% or more.

Preferably, the thickness of the CoFeCr alloy region is in the range of 3.7 Å to 11.5 Å (in terms of thickness ratio, in the range of 0.26 to 0.82), and consequently, it is possible to obtain a rate of change in resistance of 15.25% or more.

Next, the relationship between the thickness of the CoFeCr alloy region and the change in sheet resistance ($\Delta Rs$) was investigated. As the sheet resistance was increased, the rate of change in resistance ($\Delta R/R$) was considered to be increased.

Figure 10:
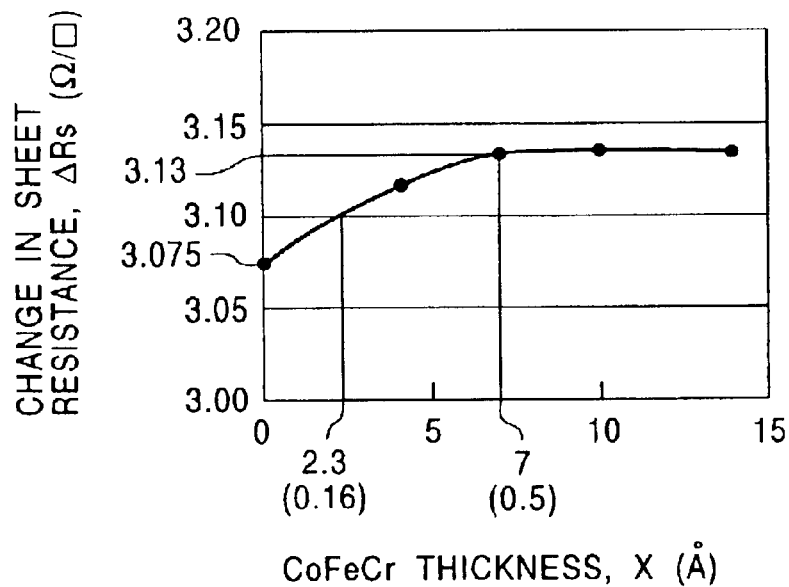
FIG. 10 is a graph showing the relationship between the thickness of a CoFeCr alloy region and the change in the sheet resistance ($\Delta Rs$) with respect to a first magnetic sublayer having a two-layered structure including the CoFeCr alloy region and a CoFe alloy region.

As shown in FIG. 10, as the thickness of the CoFeCr alloy region increased, the sheet resistance increased, and when the thickness of the CoFeCr alloy region exceeded approximately 7 Å, the sheet resistance remained substantially constant.

As is obvious from the experimental results, as long as the thickness of the CoFeCr alloy region is greater than 0 Å and less than 14 Å (in terms of the thickness ratio, greater than 0 and less than 1), the sheet resistance can be increased compared with the case in which the first magnetic sublayer is composed of a CoFe alloy only (i.e., the thickness of the CoFeCr alloy region is 0 Å), and a sheet resistance of more than 3.075 Ω/square can be obtained.

If the thickness of the CoFeCr alloy region is greater than or equal to 2.3 Å and less than 14 Å (in terms of thickness ratio, greater than or equal to 0.16 and less than 1), it is possible to obtain a sheet resistance of 3.1 Ω/square or more.

Furthermore, if the thickness of the CoFeCr alloy region is greater than or equal to 7.0 Å and less than 14 Å (in terms of thickness ratio, greater than or equal to 0.5 and less than 1), it is possible to obtain a sheet resistance of 3.13 Ω/square or more.

Although the rate of change in resistance was considered to be increased as the sheet resistance was increased as described above, as shown in FIGS. 9 and 10, actually, even when the thickness was 10 Å or more in which the sheet resistance was high, the rate of change in resistance showed a tendency of decreasing. The reason for this is considered to be due to the influence of a decrease in the unidirectional exchange bias magnetic field (Hex*) described below.

Figure 11:
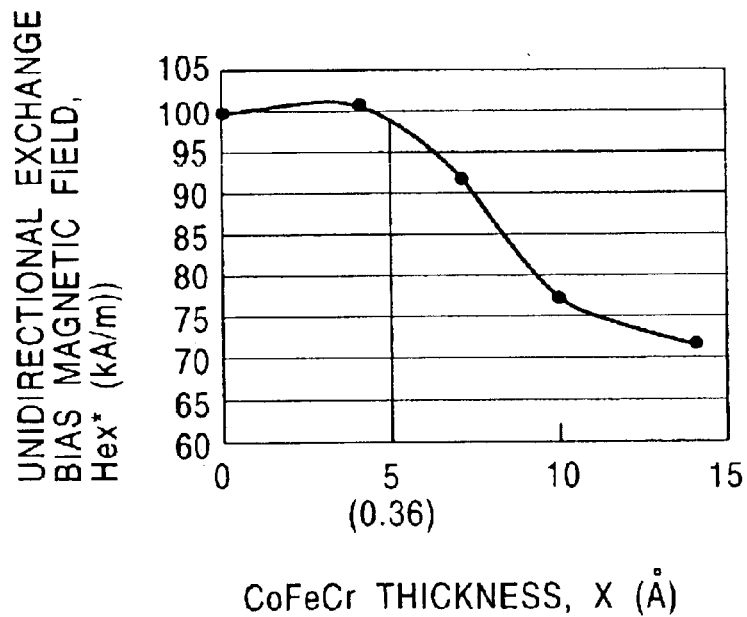
FIG. 11 is a graph showing the relationship between the thickness of a CoFeCr alloy region and the unidirectional exchange bias magnetic field (Hex*) with respect to a first magnetic sublayer having a two-layered structure including the CoFeCr alloy region and a CoFe alloy region.

FIG. 11 is a graph which shows the relationship between the thickness of the CoFeCr alloy region and the unidirectional exchange bias magnetic field (Hex*).

As shown in FIG. 11, although the unidirectional exchange bias magnetic field (Hex*) was at a maximum when the thickness of the CoFeCr alloy region was approximately 4 Å, the unidirectional exchange bias magnetic field (Hex*) decreased when the thickness was increased therefrom.

The reason for this is considered to be that the coupling magnetic field due to the RKKY interaction generated between the first magnetic sublayer and the second magnetic sublayer was decreased because the thickness of the CoFeCr alloy region was increased.

As is obvious from the experimental results shown in FIG. 11, preferably, the thickness of the CoFeCr alloy region is greater than 0 Å and less than or equal to 5 Å (in terms of thickness ratio, greater than 0 and less than or equal to 0.36). Consequently, it is possible to obtain a unidirectional exchange bias magnetic field (Hex*) of 100 kA/m or more.

As is the case with FIG. 9, the value in parentheses shown under the absolute value of the thickness of the CoFeCr alloy region in FIG. 11 is the ratio of the thickness of the CoFeCr alloy region to the total thickness of the first magnetic sublayer.

As shown in FIG. 11, when the thickness of the CoFeCr alloy region exceeded 5 Å, the unidirectional exchange bias magnetic field (Hex*) decreased significantly. Since the magnetization of the pinned magnetic layer becomes unstable because of the decrease in Hex*, as shown in FIG. 9, the rate of change in resistance is considered to decrease.

Next, the relationship between the thickness of the CoFeCr alloy region and the plateau magnetic field (Hpl) was investigated. The experimental results thereof are shown in FIG. 12.

Herein, the plateau magnetic field (Hpl) is the magnitude of an applied magnetic field at which the rate of change in resistance is 0.98 in relation to the maximum value (1.00) as shown in the hysteresis loop in FIG. 13. If the plateau magnetic field is large, the antiparallel state of the magnetizations of the first magnetic sublayer and the second magnetic sublayer are stably maintained. Therefore, a larger plateau magnetic field is preferred.

Figure 12:
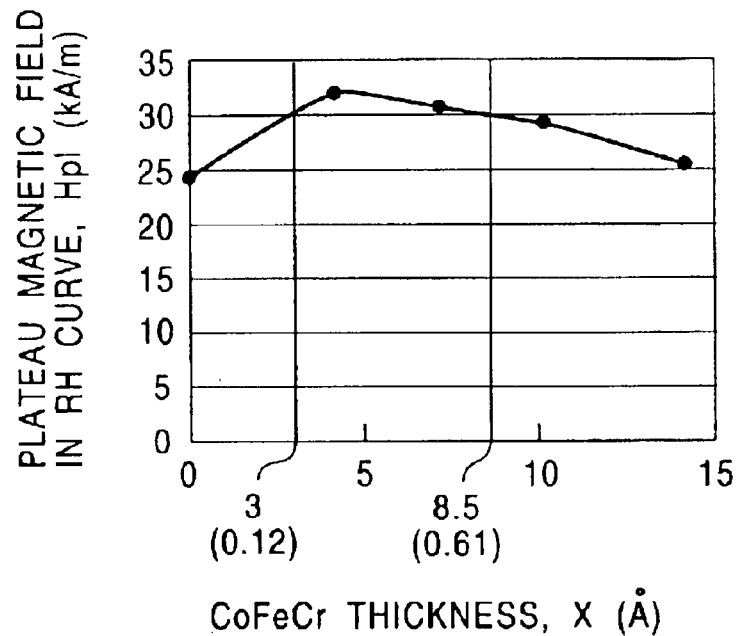
FIG. 12 is a graph showing the relationship between the thickness of a CoFeCr alloy region and the plateau magnetic field (Hpl) with respect to a first magnetic sublayer having a two-layered structure including the CoFeCr alloy region and a CoFe alloy region.

As shown in FIG. 12, the plateau magnetic field was at a maximum value when the thickness of the CoFeCr alloy region was approximately 4 Å. As the thickness of the CoFeCr alloy region increased therefrom, the plateau magnetic field gradually decreased.

As is obvious from the experimental results shown in FIG. 12, if the thickness of the CoFeCr alloy region is greater than 0 Å and less than 14 Å (in terms of thickness ratio, greater than 0 and less than 1), a larger plateau magnetic field (larger than 24 kA/m) can be obtained compared with the conventional case in which the first magnetic sublayer is composed of a CoFe alloy only.

In the present invention, if the thickness of the CoFeCr alloy region is in the range of 3 Å to 8.5 Å (in terms of thickness ratio, in the range of 0.12 to 0.61), a plateau magnetic field of 30 kA/m or more can be obtained.

Based on the experimental results described above, preferred ranges of the thickness ratio are defined as follows.

In the present invention, preferably, the ratio of the thickness of the CoFeCr alloy region to the total thickness of the first magnetic sublayer is greater than 0 and less than or equal to 0.61. Consequently, the rate of change in resistance can be increased and also the plateau magnetic field (Hpl) can be increased compared to the conventional case.

In the present invention, preferably, the ratio of the thickness of the CoFeCr alloy region to the total thickness of the first magnetic sublayer is greater than 0 and less than or equal to 0.36. Consequently, the unidirectional exchange bias magnetic field (Hex*) can be increased and also the plateau magnetic field (Hpl) can be increased compared to the conventional case. Moreover, the rate of change in resistance ($\Delta R/R$) can be increased compared to the conventional case.

In the present invention, preferably, the ratio of the thickness of the CoFeCr alloy region to the total thickness of the first magnetic sublayer is in the range of 0.26 to 0.82. Consequently, a rate of change in resistance of 15.25% or more can be obtained, and the plateau magnetic field (Hpl) can be increased compared to the conventional case.

In the present invention, preferably, the ratio of the thickness of the CoFeCr alloy region to the total thickness of the first magnetic sublayer is in the range of 0.12 to 0.61. Consequently, the rate of change in resistance ($\Delta R/R$) can be increased compared to the conventional case, and a plateau magnetic field (Hpl) of 30 kA/m or more can be obtained.

In the present invention, preferably, the ratio of the thickness of the CoFeCr alloy region to the total thickness of the first magnetic sublayer is in the range of 0.26 to 0.61. Consequently, a rate of change in resistance of 15.25% or more can be obtained, and a plateau magnetic field of 30 kA/m or more can be obtained.

Furthermore, in the present invention, preferably, the ratio of the thickness of the CoFeCr alloy region to the total thickness of the first magnetic sublayer is in the range of 0.26 to 0.36. Consequently, a rate of change in resistance of 15.25% or more can be obtained, a plateau magnetic field of 30 kA/m or more can be obtained, and the unidirectional exchange bias magnetic field (Hex*) can be increased compared to the conventional case.

Next, the relationship between the read output and the magnetic moment difference (Net Mst), which was obtained by subtracting the magnetic moment per unit area of the first magnetic sublayer from the magnetic moment per unit area of the second magnetic sublayer, was investigated.

Experiments were conducted using laminated films having the following layer structure and thicknesses (thickness value indicated in parentheses), in order from the bottom:

alumina; seed layer: $(Ni_{0.8}Fe_{0.2})_{60at\%}Cr_{40at\%}$(60 Å); antiferromagnetic layer: $Pt_{50at\%}Mn_{50at\%}$(120 Å); pinned magnetic layer: [first magnetic sublayer: $(Co_{0.9}Fe_{0.1})_{95at\%}Cr_{5at\%}$(X Å) and $Co_{90at\%}Fe_{10at\%}$(10 Å); nonmagnetic intermediate sublayer: Ru(9 Å); and second magnetic sublayer: $Co_{90at\%}Fe_{10at\%}$(22 Å)]; nonmagnetic material layer: Cu(21 Å); free magnetic layer: [$Co_{90at\%}Fe_{10at\%}$(10 Å) and $Ni_{80at\%}Fe_{20at\%}$(35 Å)]; and protective layer: Ta(30 Å).

The track width was set at 0.2 μm, and the element height was set at 0.15 μm. Furthermore, in order to apply a longitudinal bias magnetic field, permanent magnetic films were used, the product of the remanence (Mr) and the thickness (t) of the permanent magnetic films being 18.8 T·nm.

In the experiment, the relationship between the magnetic moment difference (Net Mst) and the read output was obtained while changing the magnetic moment per unit area of the first magnetic sublayer by changing the thickness X of the $(Co_{0.9}Fe_{0.1})_{95at\%}Cr_{5at\%}$ region constituting the first magnetic sublayer. The experimental results are shown in FIG. 14.

Figure 14:
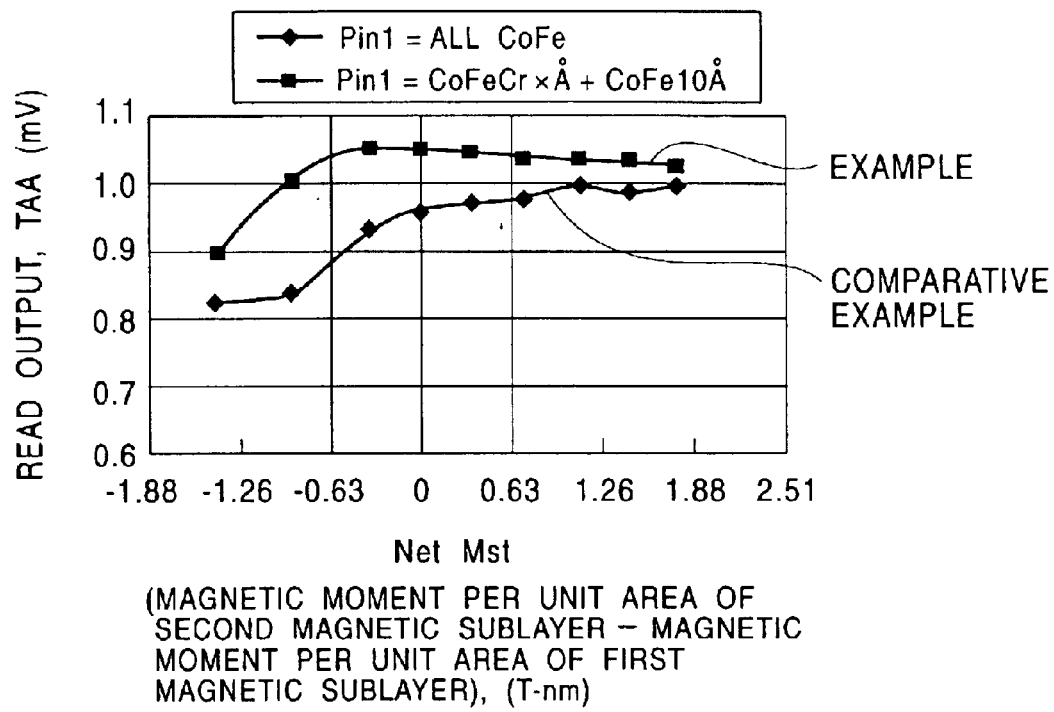
FIG. 14 is a graph showing the relationship between the magnetic moment difference (Net Mst) and the read output with respect to an Example in which the first magnetic sublayer has a two-layered structure including a CoFeCr alloy region and a CoFe alloy region and a Comparative Example in which the first magnetic sublayer is composed of a single layer of a CoFe alloy.

The graph in FIG. 14 also shows a Comparative Example in which the first magnetic sublayer was composed of a single region of a $Co_{90at\%}Fe_{10at\%}$ alloy. In the Comparative Example, the relationship between the magnetic moment difference (Net Mst) and the read output was obtained while changing the magnetic moment per unit area of the first magnetic sublayer by changing the thickness of the first magnetic sublayer.

As shown in FIG. 14, in the Comparative Example, as the magnetic moment difference decreased, the read output gradually decreased. In particular, in the Comparative Example, when the magnetic moment difference was negative, the read output rapidly decreased.

When the magnetic moment difference is negative, the magnetic moment per unit area of the first magnetic sublayer is larger than the magnetic moment per unit area of the second magnetic sublayer. Such an adjustment in the magnetic moment is performed by increasing the thickness of the first magnetic sublayer.

That is, as the magnetic moment difference decreases, the thickness of the first magnetic sublayer increases. Therefore, in the Comparative Example, as the magnetic moment difference decreased, the thickness of the first magnetic sublayer increased, and since the first magnetic sublayer was composed of a single region of the CoFe alloy having a low resistivity, the amount of shunting of the sensing current to the first magnetic sublayer was increased, resulting in a large decrease in the read output.

In contrast, in the Example of the present invention, even if the magnetic moment difference decreased, the read output did not change substantially, and rather increased slightly. The increasing tendency was observed until the magnetic moment difference reached approximately −0.63 T·nm. However, when the magnetic moment difference fell below −0.63 T·nm, the read output started to decrease.

In the Example, even if the magnetic moment difference decreased, in particular, to a negative value of −0.63 T·nm, a decrease in the read output was not observed. The reason for this is that the CoFeCr alloy region having a high resistivity was present in the first magnetic sublayer. Additionally, since the magnetic moment difference decreased, the amount of inclination of the magnetization of the pinned magnetic layer due to the magnetic field from the permanent magnet layers (hard bias layers) placed on both sides of the track was decreased, and as a result, the read output was slightly increased.

Therefore, even if the magnetic moment difference decreased, i.e., even if the thickness of the first magnetic sublayer was increased, the amount of sensing current shunting to the first magnetic sublayer was small, and thus it was possible to improve the read output compared to the Comparative Example.

Next, using the multilayer structure of the magnetic sensing element used in the experiment shown in FIG. 14, the relationship between the magnetic moment difference (Net Mst) and the inclination angle of the magnetization of the second magnetic sublayer, after annealing treatment was performed in a second magnetic field which was directed perpendicular to the height direction (i.e., in the track width direction) in the manufacturing process of the exchange bias, was investigated.

Additionally, the pinned magnetic layer was preliminarily subjected to annealing treatment in a first magnetic field in the height direction. In the annealing treatment in the first magnetic field, heat treatment was performed at 290° C. for 4 hours while applying a magnetic field of 10 kOe (approximately 800 kA/m) in the height direction.

In such a state, annealing treatment was performed in the second magnetic field. In the annealing treatment in the second magnetic field, heat treatment was performed at 290° C. for 4 hours while applying a magnetic field of 300 Oe (approximately 24 kA/m) in the track width direction. The deviation of the magnetization (inclination angle of the magnetization) of the pinned magnetic layer (second magnetic sublayer) was measured using the R-H curve in which the height direction was set as 0 degrees and the applied magnetic field was in the 90° direction. The experimental results are shown in FIG. 15.

Figure 15:
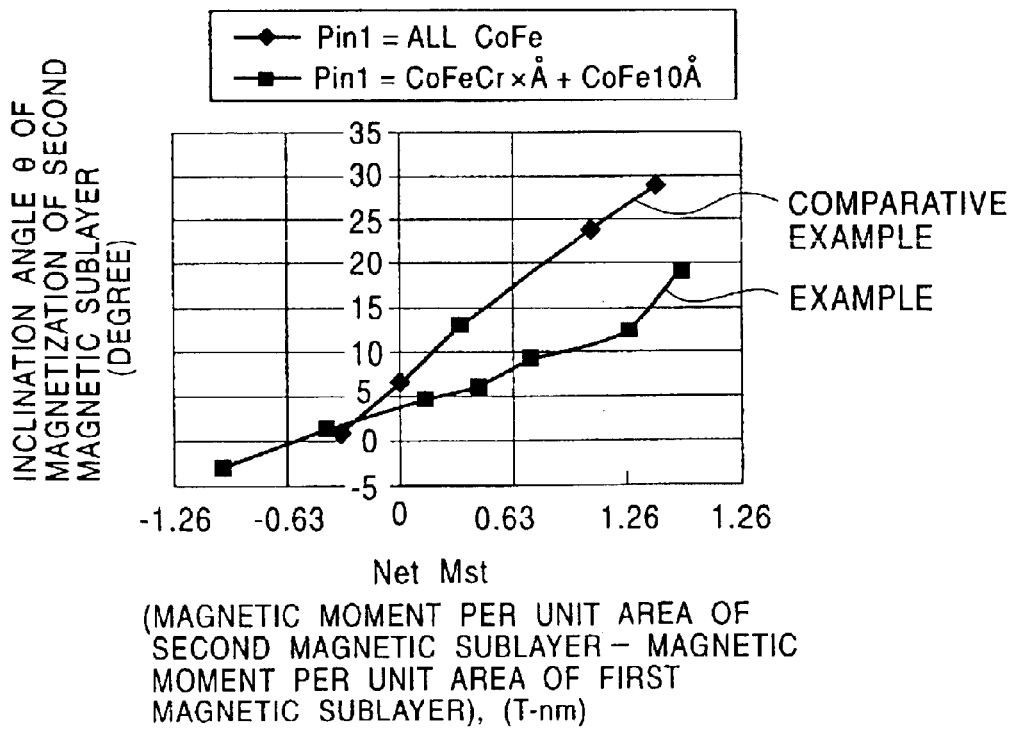
FIG. 15 is a graph showing the relationship between the magnetic moment difference (Net Mst) and the inclination angle of magnetization of the second magnetic sublayer with respect to an Example in which the first magnetic sublayer has a two-layered structure including a CoFeCr alloy region and a CoFe alloy region and a Comparative Example in which the first magnetic sublayer is composed of a single layer of a CoFe alloy.

As shown in FIG. 15, as the magnetic moment difference (Net Mst) decreased, the inclination angle of magnetization of the second magnetic sublayer decreased.

Although both the Comparative Example and the Example showed the same tendency, in the Comparative Example, when the magnetic moment difference was approximately 0.63 T·nm, the inclination angle of the magnetization of the second magnetic sublayer exceeded 15 degrees, and the perpendicular relationship in the magnetization between the pinned magnetic layer and the free magnetic layer was significantly lost. In contrast, in the Example, when the magnetic moment difference was 0.63 T·nm or less, the inclination angle of the magnetization of the second magnetic sublayer was 10 degrees or less, and when the magnetic moment was decreased to approximately −0.63 T·nm, it was possible to set the inclination angle of the magnetization of the second magnetic sublayer at substantially zero.

Preferably, the inclination angle of the magnetization of the second magnetic sublayer is as small as possible. Thereby, the asymmetry can be reduced, and the read output can be improved. In the present invention, based on the experimental results shown in FIGS. 14 and 15, the magnetic moment difference is set to be preferably in the range of −0.63 to 0.63 T·nm. However, a magnetic moment difference of 0 T·nm is excluded therefrom. The magnetic moment difference of 0 T·nm means that the magnetic moment per unit area of the first magnetic sublayer and the magnetic moment per unit area of the second magnetic sublayer are the same. In such a case, magnetization dispersion occurs in the first magnetic sublayer and the second magnetic sublayer, resulting in degradation in read characteristics. Therefore, preferably, the magnetic moment per unit area of the first magnetic sublayer and the magnetic moment per unit area of the second magnetic sublayer are different. Accordingly, in the present invention, the magnetic moment difference of 0 T·nm is excluded from the preferred range.

More preferably, the magnetic moment difference is greater than or equal to −0.63 T·nm and less than 0 T·nm. As shown in FIGS. 14 and 15, when the magnetic moment difference is negative, in the hard bias system, the read output shows a tendency of slightly increasing until the magnetic moment difference is decreased to approximately −0.63 T·nm. Thus, it is possible to improve the read output effectively compared to the Comparative Example. In the exchange bias system, it is possible to reduce the inclination angle of the magnetization of the second magnetic sublayer to 5 degrees or less, and in particular, when the magnetic moment difference is in the vicinity of −0.63 T·nm, the inclination angle of the magnetization can be set to be substantially 0 degrees.

Next, in the present invention, preferably, the thickness of the first magnetic sublayer is larger than the thickness of the second magnetic sublayer. The magnetic moment per unit area corresponds to the product of the saturation magnetization (Ms) and the thickness (t). As described above, the magnetic moment difference is preferably negative, and in order to set the magnetic moment difference to be negative, the thickness of the first magnetic sublayer is preferably larger than the thickness of the second magnetic sublayer.

Figure 16:
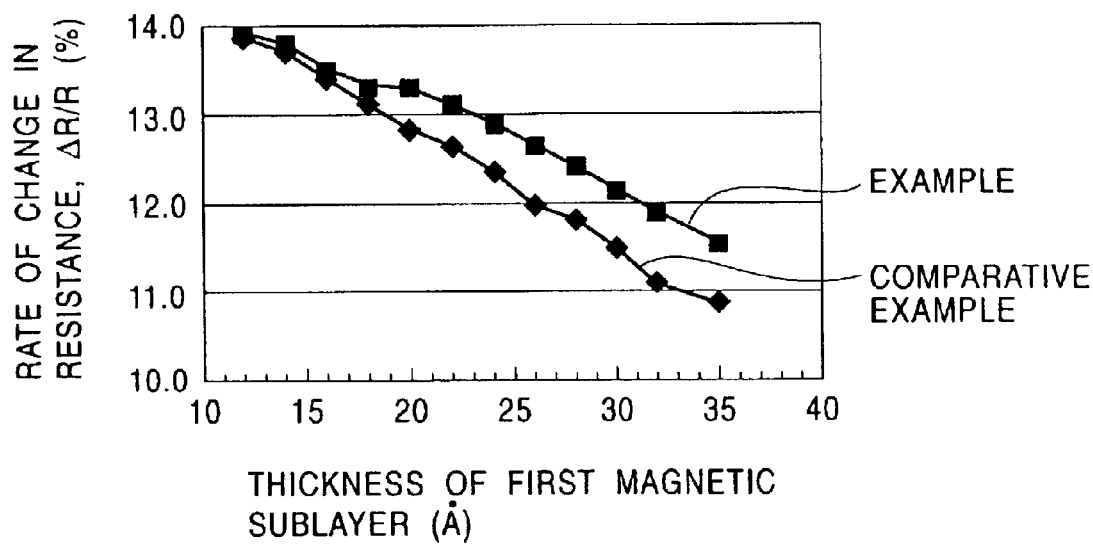
FIG. 16 is a graph showing the relationship between the thickness of the first magnetic layer and the rate of change in resistance ($\Delta R/R$) with respect to an Example in which the first magnetic sublayer has a two-layered structure including a CoFeCr alloy region and a CoFe alloy region and a Comparative Example in which the first magnetic sublayer is composed of a single layer of a CoFe alloy.
Figure 17:
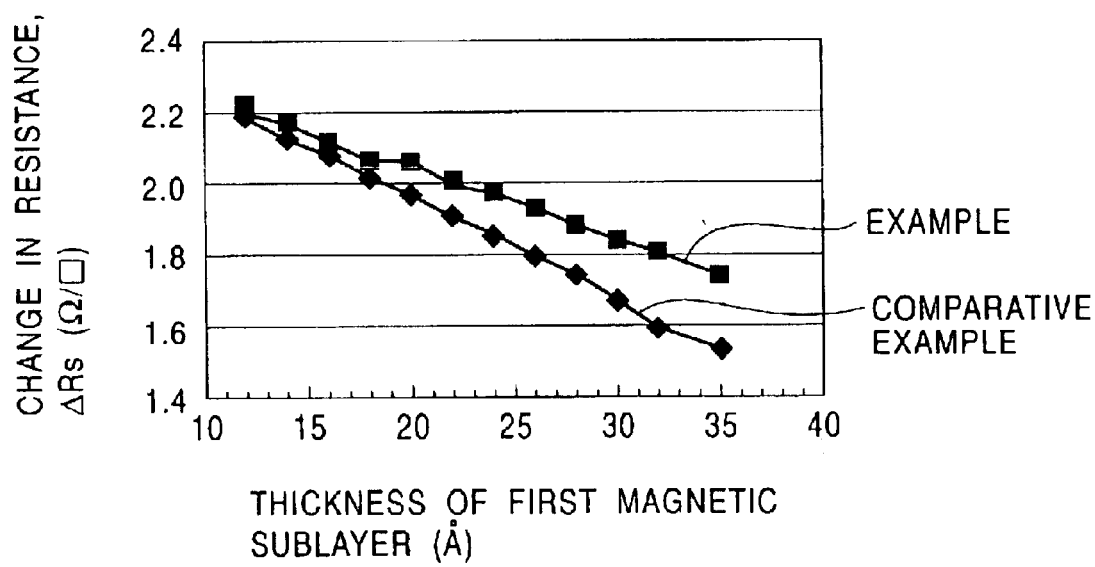
FIG. 17 is a graph showing the relationship between the thickness of the first magnetic layer and the change in resistance ($\Delta Rs$) with respect to an Example in which the first magnetic sublayer has a two-layered structure including a CoFeCr alloy region and a CoFe alloy region and a Comparative Example in which the first magnetic sublayer is composed of a single layer of a CoFe alloy.
Figure 18:
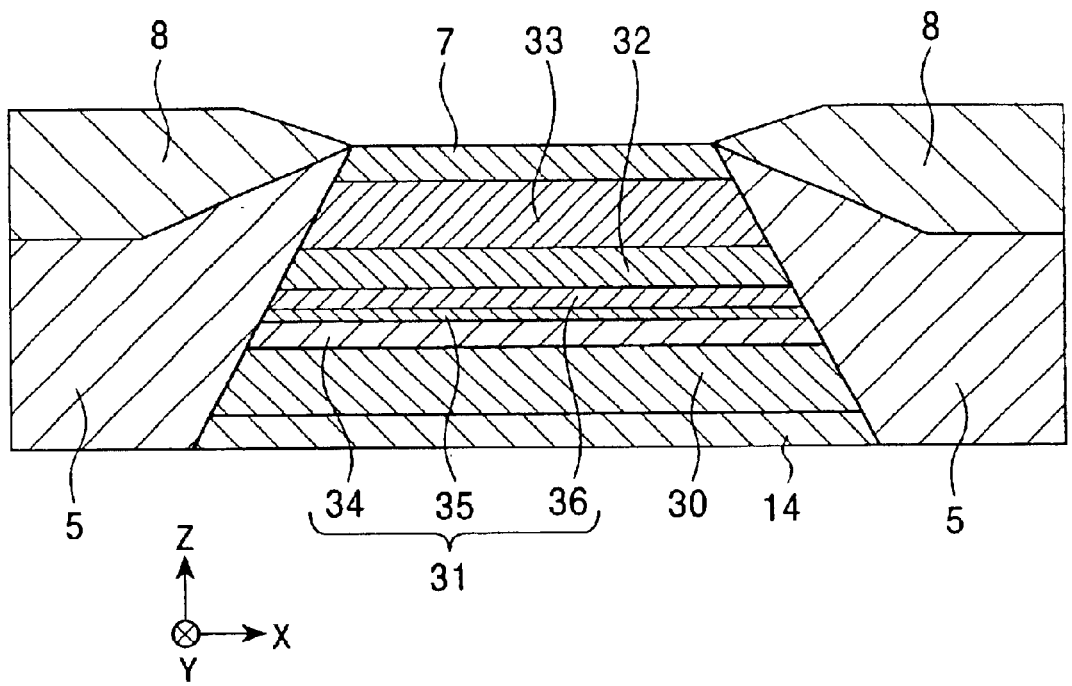
FIG. 18 is a partial sectional view showing the structure of a conventional magnetic sensing element, viewed from the surface facing a recording medium.
Figure 19:
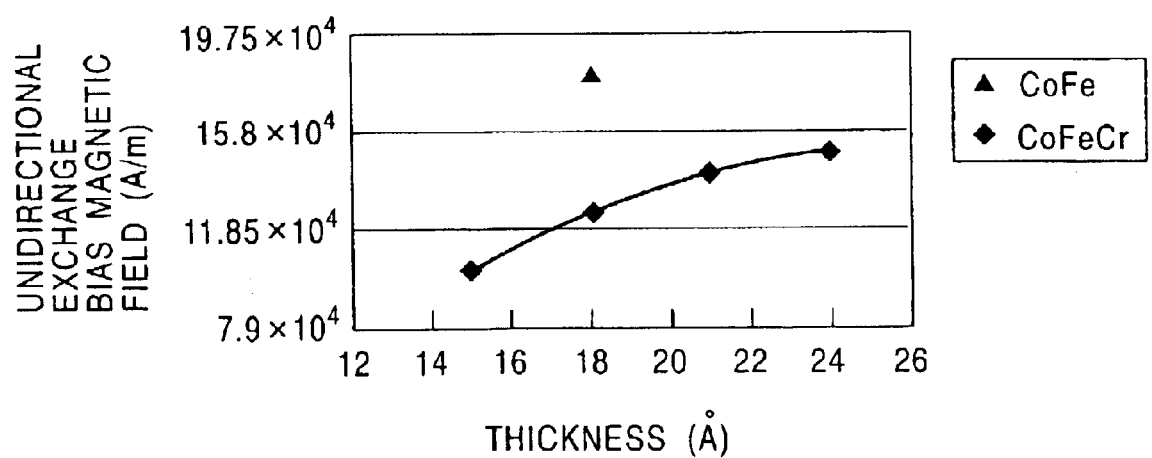
FIG. 19 is a graph showing the relationship between the thickness of the first magnetic sublayer and the unidirectional exchange bias magnetic field (Hex*) with respect to a case in which the first magnetic sublayer is composed of a single layer of a CoFe alloy and a case in which the first magnetic sublayer is composed of a single layer of a CoFeCr alloy.

FIG. 16 is a graph showing the relationship between the thickness of the first magnetic sublayer and the rate of change in resistance (ΔR/R), and FIG. 17 is a graph showing the relationship between the thickness of the first magnetic sublayer and the change in resistance (ΔRs).

In the Comparative Example and the Example shown in FIG. 16, magnetic sensing elements having the same layer structures as those used in the experiment shown in FIG. 14 were used.

As shown in FIGS. 16 and 17, in each of the Comparative Example and the Example, as the thickness of the first magnetic sublayer increased, the rate of change in resistance (ΔR/R) or the change in resistance (ΔRs) gradually decreased. However, as is obvious from the graphs, in the Example, a decrease in the rate of change in resistance or the change in resistance was smaller compared to the Comparative Example. The reason for this is that since the CoFeCr alloy region having a high resistivity was present in the first magnetic sublayer of the magnetic sensing element in the Example, the sensing current did not easily shunt to the first magnetic sublayer.

As described above, in the present invention, even if the thickness of the first magnetic sublayer is increased, the decrease in the rate of change in resistance (ΔR/R) or the change in resistance (ΔRs) can be appropriately reduced.

Moreover, since the first magnetic sublayer can be formed so as to have a large thickness, the magnetic moment difference (Net Mst) can be decreased, and as a result, the unidirectional exchange bias magnetic field (Hex*) can be increased, and the inclination angle of the magnetization of the second magnetic sublayer can be reduced.

Furthermore, by forming a magnetic region having a high resistivity, for example, a CoFeX alloy region, in the first magnetic sublayer in contact with the antiferromagnetic layer, the exchange coupling magnetic field (Hex) generated between the antiferromagnetic layer and the first magnetic sublayer is increased. Therefore, the inclination of the magnetization of the pinned magnetic layer, due to a decrease in the exchange coupling magnetic field (Hex) of the first magnetic sublayer when the thickness of the first magnetic sublayer is increased, can be minimized.

As described above, by adjusting the magnetic moment difference (Net Mst) and the thickness appropriately, even if the track width is narrowed and the element height is decreased, it is possible to produce a magnetic sensing element in which fluctuations in the magnetization of the pinned magnetic layer are small, asymmetry can be improved, and read output is increased, and which is suitable for higher recording densities.

What is claimed is:

1. An exchange coupled film comprising an antiferromagnetic layer and a ferromagnetic layer, a magnetization direction of the ferromagnetic layer being pinned in a predetermined direction by an exchange coupling magnetic field generated at an interface between the antiferromagnetic layer and the ferromagnetic layer,
    wherein the ferromagnetic layer has a laminated ferrimagnetic structure comprising a first magnetic sublayer formed in contact with the antiferromagnetic layer, and a second magnetic sublayer facing the first magnetic sublayer with a nonmagnetic intermediate sublayer therebetween; and
    wherein the first magnetic sublayer comprises a region containing X in which the X content gradually decreases from an antiferromagnetic layer side toward a nonmagnetic intermediate sublayer side, wherein X is at least one element selected from the group consisting of Cr, Ti, V, Zr, Nb, Mo, Hf, Ta, and W, the region containing X extending from an interface with the antiferromagnetic layer toward the nonmagnetic intermediate sublayer, and a region not containing X extending from an interface with the nonmagnetic intermediate sublayer toward the antiferromagnetic layer.

2. The exchange coupled film according to claim 1, wherein the first magnetic sublayer comprises CoFe alloys as major ingredients, the region containing X comprises a CoFeX alloy, and the region not containing X comprises a CoFe alloy.

3. The exchange coupled film according to claim 2, wherein a ratio of a thickness of the region comprising the CoFeX alloy to a total thickness of the first magnetic sublayer is greater than 0 and less than or equal to 0.61.

4. The exchange coupled film according to claim 2, wherein a ratio of a thickness of the region comprising the CoFeX alloy to a total thickness of the first magnetic sublayer is greater than 0 and less than or equal to 0.36.

5. The exchange coupled film according to claim 2, wherein a ratio of a thickness of the region comprising the CoFeX alloy to a total thickness of the first magnetic sublayer is in the range of 0.26 to 0.82.

6. The exchange coupled film according to claim 2, wherein a ratio of a thickness of the region comprising the CoFeX alloy to a total thickness of the first magnetic sublayer is in the range of 0.12 to 0.61.

7. The exchange coupled film according to claim 2, wherein a ratio of a thickness of the region comprising the CoFeX alloy to a total thickness of the first magnetic sublayer is in the range of 0.26 to 0.61.

8. The exchange coupled film according to claim 2, wherein a ratio of a thickness of the region comprising the CoFeX alloy to a total thickness of the first magnetic sublayer is in the range of 0.26 to 0.36.

9. The exchange coupled film according to claim 2, wherein the Co/Fe atomic ratio is in the range of 85/15 to 96/4.

10. The exchange coupled film according to claim 1, wherein the X content in the region containing X is in the range of 3 to 15 atomic percent.

11. The exchange coupled film according to claim 1, wherein a magnetic moment difference obtained by subtracting a magnetic moment per unit area of the first magnetic sublayer from a magnetic moment per unit area of the second magnetic sublayer is in the range of −0.63 to 0.63 T·nm, the magnetic moment difference excluding 0 T·nm.

12. The exchange coupled film according to claim 11, wherein the magnetic moment difference is negative.

13. The exchange coupled film according to claim 12, wherein a thickness of the first magnetic sublayer is larger than a thickness of the second magnetic sublayer.

14. A magnetic sensing element comprising:
    an antiferromagnetic layer;
    a pinned magnetic layer;
    a nonmagnetic material layer; and
    a free magnetic layer, a magnetization direction of the free magnetic layer being aligned in a direction substantially perpendicular to a magnetization direction of the pinned magnetic layer,
    wherein the antiferromagnetic layer and the pinned magnetic layer correspond to an exchange coupled film according to claim 1.

15. A magnetic sensing element comprising:
    an antiferromagnetic exchange bias layer;
    a free magnetic layer;
    a nonmagnetic material layer;
    a pinned magnetic layer, a magnetization direction of the free magnetic layer being aligned in a direction substantially perpendicular to a magnetization direction of the pinned magnetic layer;
    an antiferromagnetic layer;
    a ferromagnetic layer placed between the antiferromagnetic exchange bias layer and the free magnetic layer, the ferromagnetic layer being in contact with the antiferromagnetic exchange bias layer; and
    a nonmagnetic interlayer placed between the ferromagnetic layer and the free magnetic layer, the ferromagnetic layer, the nonmagnetic interlayer, and the free magnetic layer forming a laminated ferrimagnetic structure,
    wherein the ferromagnetic layer corresponds to a first magnetic sublayer according to claim 1 and the free magnetic layer corresponds to a second magnetic sublayer according to claim 1.

16. A magnetic sensing element according to claim 15, wherein the antiferromagnetic layer and the pinned magnetic layer correspond to an exchange coupled film according to claim 1.

17. A magnetic sensing element comprising:

a free magnetic layer;

an upper nonmagnetic material layer placed on the free magnetic layer;

a lower nonmagnetic material layer placed under the free magnetic layer;

an upper pinned magnetic layer placed on the upper nonmagnetic material layer;

a lower pinned magnetic layer placed under the lower nonmagnetic material layer;

an upper antiferromagnetic layer placed on the upper pinned magnetic layer;

a lower antiferromagnetic layer placed under the lower pinned magnetic layer; and a seed layer placed under the lower antiferromagnetic layer, a magnetization direction of the free magnetic layer being aligned in a direction substantially perpendicular to a magnetization direction of the upper pinned magnetic layer and the lower pinned magnetic layer, wherein the upper antiferromagnetic layer and the upper pinned magnetic layer correspond to an exchange coupled film according to claim 1, and the lower antiferromagnetic layer and the lower pinned magnetic layer correspond to the exchange coupled film according to claim 1.

18. A magnetic sensing element according to claim 1, wherein the first magnetic sublayer contacts the antiferromagnetic layer.

19. An exchange coupled film comprising an antiferromagnetic layer and a ferromagnetic layer, a magnetization direction of the ferromagnetic layer being pinned in a predetermined direction by an exchange coupling magnetic field generated at an interface between the antiferromagnetic layer and the ferromagnetic layer, wherein the ferromagnetic layer has a laminated ferrimagnetic structure comprising a first magnetic sublayer in contact with the antiferromagnetic layer, and a second magnetic sublayer facing the first magnetic sublayer with a nonmagnetic intermediate sublayer therebetween;

wherein the first magnetic sublayer contains X, wherein X is at least one element selected from the group consisting of Cr, Ti, V, Zr, Nb, Mo, Hf, Ta, and W; and wherein an X content in a vicinity of an interface between the first magnetic sublayer and the antiferromagnetic layer is higher than the X content in a vicinity of an interface between the first magnetic sublayer and the nonmagnetic intermediate sublayer, and the X content gradually decreases from an antiferromagnetic layer side toward a nonmagnetic intermediate sublayer side.

20. The exchange coupled film according to claim 19, wherein the first magnetic sublayer comprises a magnetic material comprising a CoFe alloy containing X.

21. A magnetic sensing element according to claim 19, wherein the first magnetic sublayer contacts the antiferromagnetic layer.

22. An exchange coupled film comprising an antiferromagnetic layer and a ferromagnetic layer, a magnetization direction of the ferromagnetic layer being pinned in a predetermined direction by an exchange coupling magnetic field generated at an interface between the antiferromagnetic layer and the ferromagnetic layer, wherein the ferromagnetic layer has a laminated ferrimagnetic structure comprising a first magnetic sublayer formed in contact with the antiferromagnetic layer, and a second magnetic sublayer facing the first magnetic sublayer with a nonmagnetic intermediate sublayer therebetween;

wherein the first magnetic sublayer comprises at least two magnetic zones, a magnetic zone in contact with the antiferromagnetic layer comprising a magnetic material containing X such that the X content gradually decrease from an antiferromagnetic layer side toward a nonmagnetic intermediate sublayer side, wherein X is at least one element selected from the group consisting of Cr, Ti, V, Zr, Nb, Mo, Hf, Ta, and W, and a magnetic zone in contact with the nonmagnetic intermediate sublayer comprising a magnetic material not containing X.

23. The exchange coupled film according to claim 22, wherein the magnetic zone in contact with the antiferromagnetic layer comprises a CoFeX alloy, and the magnetic zone in contact with the nonmagpetic intermediate sublayer comprises a CoFe alloy.

24. The exchange coupled film according to claim 23, wherein a ratio of a thickness of the magnetic zone comprising the CoFeX alloy to a total thickness of the first magnetic sublayer is greater than 0 and less than or equal to 0.61.

25. The exchange coupled film according to claim 23, wherein a ratio of a thickness of the magnetic zone comprising the CoFeX alloy to a total thickness of the first magnetic sublayer is greater than 0 and less than or equal to 0.36.

26. The exchange coupled film according to claim 23, wherein a ratio of a thickness of the magnetic zone comprising the CoFeX alloy to a total thickness of the first magnetic sublayer is in the range of 0.26 to 0.82.

27. The exchange coupled film according to claim 23, wherein a ratio of a thickness of the magnetic zone comprising the CoFeX alloy to a total thickness of the first magnetic sublayer is in the range of 0.12 to 0.61.

28. The exchange coupled film according to claim 23, wherein a ratio of a thickness of the magnetic zone comprising the CoFeX alloy to a total thickness of the first magnetic sublayer is in the range of 0.26 to 0.61.

29. The exchange coupled film according to claim 23, wherein a ratio of a thickness of the magnetic zone comprising the CoFeX alloy to a total thickness of the first magnetic sublayer is in the range of 0.26 to 0.36.

30. The exchange coupled film according to claim 23, wherein the Co/Fe atomic ratio is in the range of 85/15 to 96/4.

31. A magnetic sensing element according to claim 22, wherein the first magnetic sublayer contacts the antiferromagnetic layer.

32. An exchange coupled film comprising:

an antiferromagnetic layer; and a ferromagnetic layer having a magnetization direction pinned in a predetermined direction by an exchange coupling magnetic field generated at an interface between the antiferromagnetic layer and the ferromagnetic layer, wherein the ferromagnetic layer has a laminated ferrimagnetic structure comprising a first magnetic sublayer formed in contact with the antiferromagnetic layer, and a second magnetic sublayer facing the first magnetic sublayer with a nonmagnetic intermediate sublayer therebetween, and the first magnetic sublayer contains X at an interface with the antiferromagnetic layer and does not contain X at an interface with the nonmagnetic intermediate sublayer, in which X is at least one element selected from the group consisting of Cr, Ti, V, Zr, Nb, Mo, Hf, Ta, and W and the X content gradually decreases from an antiferromagnetic layer side toward a nonmagnetic intermediate sublayer side.

33. A magnetic sensing element according to claim 32, wherein the first magnetic sublayer contacts the antiferromagnetic layer.

* * * * *

UNITED STATES PATENT AND TRADEMARK OFFICE
CERTIFICATE OF CORRECTION

PATENT NO. : 6,891,703 B2
APPLICATION NO. : 10/197955
DATED : May 10, 2005
INVENTOR(S) : Naoya Hasegawa It is certified that error appears in the above-identified patent and that said Letters Patent is hereby corrected as shown below:

In the Claims

Column 42, in claim 23, line 4, before "intermediate sublayer" delete "nonmagpetic" and substitute --nonmagnetic-- in its place.

Signed and Sealed this

Twenty-fifth Day of July, 2006

JON W. DUDAS
*Director of the United States Patent and Trademark Office*